US009005420B2

(12) United States Patent
Tomantschger et al.

(10) Patent No.: US 9,005,420 B2
(45) Date of Patent: *Apr. 14, 2015

(54) VARIABLE PROPERTY ELECTRODEPOSITING OF METALLIC STRUCTURES

(75) Inventors: Klaus Tomantschger, Mississauga (CA); Glenn Hibbard, Toronto (CA); Gino Palumbo, Toronto (CA); Iain Brooks, Toronto (CA); Jonathan McCrea, Toronto (CA); Fred Smith, Hannon (CA)

(73) Assignee: Integran Technologies Inc., Mississagua, Ontario (CA)

( * ) Notice: Subject to any disclaimer, the term of this patent is extended or adjusted under 35 U.S.C. 154(b) by 1364 days.

This patent is subject to a terminal disclaimer.

(21) Appl. No.: 12/003,224

(22) Filed: Dec. 20, 2007

(65) Prior Publication Data

US 2009/0159451 A1 Jun. 25, 2009

(51) Int. Cl.
C25D 5/18 (2006.01)
C25D 15/02 (2006.01)
(Continued)

(52) U.S. Cl.
CPC *C25D 15/02* (2013.01); *C25D 1/00* (2013.01); *C25D 5/022* (2013.01); *C25D 5/08* (2013.01); *C25D 5/10* (2013.01); *C25D 5/14* (2013.01); *C25D 5/16* (2013.01); *C25D 5/18* (2013.01); *C25D 15/00* (2013.01); *C25D 21/10* (2013.01);
(Continued)

(58) Field of Classification Search
USPC .......... 205/105, 96, 148, 102, 103, 104, 149, 205/170
See application file for complete search history.

(56) References Cited

U.S. PATENT DOCUMENTS 4,869,971 A    9/1989  Nee
5,320,719 A *  6/1994  Lasbmore et al. ............ 205/104
(Continued)

FOREIGN PATENT DOCUMENTS

WO    WO 98/40326 A1    9/1998
WO    WO 2004001100 A1 * 12/2003
(Continued)

OTHER PUBLICATIONS

H.Wang S. Yao, S. Matsumura. "Preparation, characterization, and the study of the thermal strain in Ni-W gradient deposits wtih nanostructure" Surface and Coatings Technology. vol. 157, pp. 166-170, 2002.*
(Continued)

*Primary Examiner* — Edna Wong
*Assistant Examiner* — Louis Rufo
(74) *Attorney, Agent, or Firm* — Bacon & Thomas, PLLC

(57) ABSTRACT

Variable property deposit, at least partially of fine-grained metallic material, optionally containing solid particulates dispersed therein, is disclosed. The electrodeposition conditions in a single plating cell are suitably adjusted to once or repeatedly vary at least one property in the deposit direction. In one embodiment denoted multidimension grading, property variation along the length and/or width of the deposit is also provided. Variable property metallic material deposits containing at least in part a fine-grained microstructure and variable property in the deposit direction and optionally multidimensionally, provide superior overall mechanical properties compared to monolithic fine-grained (average grain size: 2 nm-5 micron), entirely coarse-grained (average grain size: >20 micron) or entirely amorphous metallic material deposits.

22 Claims, 5 Drawing Sheets

(51) Int. Cl.

| | | |
|---|---|---|
| *C25D 1/00* | (2006.01) | |
| *C25D 5/02* | (2006.01) | |
| *C25D 5/08* | (2006.01) | |
| *C25D 5/10* | (2006.01) | |
| *C25D 5/14* | (2006.01) | |
| *C25D 5/16* | (2006.01) | |
| *C25D 15/00* | (2006.01) | |
| *C25D 21/10* | (2006.01) | |
| *C25D 21/12* | (2006.01) | |
| *C25D 21/14* | (2006.01) | |
| *C25D 17/00* | (2006.01) | |
| *C23C 14/34* | (2006.01) | |
| *C25D 5/00* | (2006.01) | |
| *C25D 7/00* | (2006.01) | |
| *C25D 1/02* | (2006.01) | |
| *C25D 1/04* | (2006.01) | |

(52) U.S. Cl.
CPC ............... *C25D 21/12* (2013.01); *C25D 21/14* (2013.01); *C25D 17/008* (2013.01); *C23C 14/3414* (2013.01); *C25D 5/00* (2013.01); *C25D 7/00* (2013.01); *C25D 1/02* (2013.01); *C25D 1/04* (2013.01)

(56) References Cited

U.S. PATENT DOCUMENTS

| | | | |
|---|---|---|---|
| 5,352,266 A | 10/1994 | Erb et al. | |
| 5,433,797 A * | 7/1995 | Erb et al. | 148/304 |
| 5,489,306 A | 2/1996 | Gorski | |
| 5,549,151 A | 8/1996 | Yang | |
| 6,063,149 A | 5/2000 | Zimmer | |
| 6,071,398 A * | 6/2000 | Martin et al. | 205/103 |
| 6,114,048 A | 9/2000 | Jech et al. | |
| 6,319,610 B1 | 11/2001 | Zimmer | |
| 6,409,904 B1 * | 6/2002 | Uzoh et al. | 205/137 |
| 6,533,831 B2 | 3/2003 | Zimmer | |
| 6,547,944 B2 | 4/2003 | Schreiber | |
| 6,562,216 B2 * | 5/2003 | Schlenkert et al. | 205/104 |
| 6,630,423 B2 | 10/2003 | Alvin et al. | |
| 6,685,817 B1 * | 2/2004 | Mathieu | 205/137 |
| 6,989,084 B2 * | 1/2006 | Tench et al. | 204/275.1 |
| 7,048,767 B2 | 5/2006 | Namavar | |
| 7,425,255 B2 * | 9/2008 | Detor et al. | 205/81 |
| 7,521,128 B2 | 4/2009 | Schuh | |
| 7,951,600 B2 | 5/2011 | Lund | |
| 2002/0071962 A1 | 6/2002 | Schreiber | |
| 2002/0192503 A1 | 12/2002 | Okada et al. | |
| 2004/0011432 A1 | 1/2004 | Podlaha et al. | |
| 2005/0023688 A1 * | 2/2005 | Park et al. | 257/758 |
| 2005/0205425 A1 | 9/2005 | Palumbo et al. | |
| 2006/0021878 A1 | 2/2006 | Lu et al. | |
| 2006/0054505 A1 * | 3/2006 | Herdman et al. | 205/103 |
| 2006/0135281 A1 * | 6/2006 | Palumbo et al. | 473/316 |
| 2006/0135282 A1 | 6/2006 | Palumbo et al. | |
| 2006/0160636 A1 * | 7/2006 | Palumbo et al. | 473/316 |
| 2006/0265926 A1 * | 11/2006 | Sietsema | 42/76.02 |
| 2006/0272949 A1 * | 12/2006 | Detor et al. | 205/238 |
| 2007/0089993 A1 | 4/2007 | Schwartz et al. | |
| 2007/0269648 A1 * | 11/2007 | Schuh et al. | 428/323 |
| 2009/0130425 A1 | 5/2009 | Whitaker | |
| 2009/0217812 A1 | 9/2009 | Whitaker | |
| 2011/0008646 A1 | 1/2011 | Cahalen | |

FOREIGN PATENT DOCUMENTS

| | | |
|---|---|---|
| WO | WO 2006/063468 A1 | 6/2006 |
| WO | 2007021980 | 2/2007 |
| WO | WO 2007021980 A2 * | 2/2007 |
| WO | 2009045593 | 4/2009 |
| WO | 2010144509 | 12/2010 |

OTHER PUBLICATIONS

Hongzhi Wang, Suwei Yao, Sowjun Matsumura, Electrochemical preparation and characterization of Ni/SiC gradient deposit, Journal of Materials Processing Technology, vol. 145, Issue 3, Feb. 1, 2004, pp. 299-302.*

D. Zhu, W.N. Lei, N.S. Qu, H.Y. Xu, Nanocrystaline Electroforming Process, CIRP Annals—Manufacturing Technology, vol. 51, Issue 1, 2002, pp. 173-176, ISSN 0007-8506, http://dx.doi.org/10.1016/S0007-8506(07)61493-0.*

F. Mueller, "Pulse Plating & Other Myths", Plating & Surface Finishing, pp. 54-55, Apr. 2000.

D. Gabe. et. al., "Protective Layered Electrodeposits", Electrochemica Acta, vol. 39, No. 8/9, pp. 1115-1121, 1994.

S.J. Bull et. al., "Multilayer Coatings for Improved Performance", Surface & Coating Technology 78 (1996) 173-184.

Detor et al: "Tailoring and patterning the grain size of nanocrystalline alloys," Acta Materialia, Elsevier, Oxford, GB, vol. 55, No. 1 (Nov. 30, 2006), pp. 371-379.

Low, C.T.J. et al: "Electrodeposition of composite coatings containing nanoparticles in a metal deposit", Surface and Coatings Technology, Elsevier, Amsterdam, NL, vol. 201, No. 1-2 (Sep. 12, 2006), pp. 371-383.

Q. Huang et al: "Electrodeposition of FeCoNiCu/Cu compositionally modulated multilayers", Journal of the Electrochemical Society, vol. 149, No. 6, (Apr. 30, 2002), pp. C349-C354.

* cited by examiner

VARIABLE PROPERTY ELECTRODEPOSITING OF METALLIC STRUCTURES

TECHNICAL FIELD

The invention is directed to DC or pulse electrodepositing a metallic material to provide a variable property product containing, at least in part, a fine-grained metallic material with an average grain-size between 2 and 5,000 nm.

BACKGROUND OF THE INVENTION

Modern lightweight and durable articles require a variety of physical properties which frequently are not achievable with a monolithic material approach. Materials with variable properties, that is variation in a property among different levels or layers, over the depth of the article, are described in prior art. These include parts with graded properties, that is having in different levels, different porosities, compositions, grain sizes, filler amounts and/or hardness.

One approach to providing metallic articles graded according to one or more properties, that is multilayers with different properties in different layers, is by compaction of sintered powder. This method is disadvantageous because it incorporates impurities, provides limited shapes, is high energy requiring, and is not readily scalable.

It has been recognized that a better method for producing multilevel and or multilayered products comprising metallic material is by pulse electrodeposition. Detor et al. U.S. Patent Application Publication No. U.S. 2006/0272949 A1 teaches an electrodeposition process involving bipolar pulsing and selection and variation of Polarity Ratio to provide graded structures with different grain sizes and/or compositions in different grades solely in the deposition direction. Changing the Polarity Ratio involves changing amplitude and/or duration of negative portions of a pulse relative to positive portions. This method has the disadvantages that it is not applicable to pure metals, i.e., is only applicable to alloys, and that it is dependent for grading on changing Polarity Ratio, a parameter that is not directly supplied to the system. The employment of reverse pulses requires expensive power supplies and results in a significantly reduced plating efficiency as metal dissolution occurs during the reverse pulses.

SUMMARY OF THE INVENTION

It is an object of the invention to produce a thick (20 microns to 5 cm) variable-property electrodeposit comprising metallic-material and optionally containing particulates, having a crystalline microstructure with a fine grain size, i.e., with an average grain size between 2 nm and 5,000 nm through at least part of its thickness, which may be a coating (on at least part of a surface of a substrate) or in free-standing form. The microstructure, in part, can also contain amorphous and/or coarse-grained sections. The term "variable property" in this context refers to several structures: (1) graded structures, wherein at least one property is being varied by at least 10% and as much as infinity in the deposit direction between deposit grades (levels) and optionally also within a deposit grade (level), i.e., along the length or width of a deposit grade; (2) layered structures, comprising multiple sublayers with different properties sandwiched/stacked on top of each other and (3) mixed variable property and layered structures wherein the deposit contains sub-structures comprising both (1) and (2). Properties within a sublayer which each are defined as having a minimum thickness of 1.5 nm, typically remain the same. Therefore there is a stepwise/abrupt change in properties (e.g, grain size) between sublayers. Sublayers with different properties can then be alternated or new properties can be introduced in subsequent sublayers to assemble the final deposit.

The property being altered can be, for example, grain size, crystallographic orientation, crystallographic texture, hardness, yield strength, Young's modulus, resilience, elastic limit, ductility, internal or residual deposit stress, stiffness, chemical composition, corrosion rate, porosity, coefficient of thermal expansion, coefficient of friction, electrical conductivity, magnetic coercive force or in the case of metal matrix composites, volume particulate fraction, particulate particle size, particulate shape and/or particulate chemistry. Preferably the variation in a property between grades (levels) is by at least 10%, more preferably by at least 50%, even more preferably by at least 100% and up to 2,500,000%.

In the case of coatings, the substrate surface can be "even" including flat and/or constituted of complex parts, i.e., without narrow and/or deep recesses. The term "even" in this context means substrates to be plated do not contain small holes, recesses, vias etc. which could be characterized by the term "inaccessible recesses" from a plating, electrolyte penetration point of view.

Of special interest is that the variable property deposit is prepared in a single plating tank. In the past, i.e., layered structures of different composition but with uniform properties in the layer were obtained by using several plating tanks each containing a dedicated electrolyte and without varying the plating conditions. The workpiece was simply moved from one tank to the next, with repetitive washing steps in between, to effect the property change. The disadvantage of this approach is increased floor space, increased capital equipment and increased processing cost due to the cost of water purification and disposal for the wash water. An added cost/risk is cross contamination particularly with complex parts which may form cups etc. entrapping electrolyte which cannot be easily removed by washing steps significantly increasing the bath maintenance and overall operating cost.

It is a further object of this invention to provide uninterrupted formation of variable property structures using a DC and/or pulse electrodeposition process relying on no pulsing, monopolar pulsing and/or bipolar pulsing in a single plating tank by adjusting one or more electrodeposition parameters, e.g. two or more electrodeposition parameters, for the single tank process. The invention contemplates changing microstructures from fine-grained crystalline to greater or less fine-grained crystalline and/or to coarse-grained crystalline (average size greater than 10 microns) and/or to polycrystalline and/or to amorphous and/or to quasi-crystalline (aperiodic structures that produce pure Bragg point diffraction spectra and lacking a regular repeating structure). In all cases the fine-grained metallic microstructure is provided to a thickness over a layer cross-section in the deposition direction of at least 1.5 nm, preferably at least 2.5 microns, more preferably at least 30 microns, and even more preferably at least 50 microns. Overall the fine-grained material is contained in a single layer or multiple layers that in total represent at least 5%, preferably 25%, more preferably 50%, even more preferably 75%, of the cross-sectional thickness, of the total deposit.

These objects are obtained by the invention herein which is directed to a method of preparing a variable property metallic deposit, comprising the steps of electrodepositing a metallic material from an aqueous electrolyte in a single electrolytic cell having at least one anode and at least one cathode with electrodepositing parameters being average current density ranging from 5 to 10,000 mA/cm$^2$; forward pulse on time ranging from 0.1 to 500 ms or as provided by DC electrodeposition processing; pulse off time ranging from 0 to 10,000 ms; reverse pulse on time ranging from 0 to 500 ms; peak forward current density ranging from 5 to 10,000 mA/cm$^2$; peak reverse current density ranging from 5 to 20,000 mA/cm$^2$ except when reverse pulse on time is zero and them peak reverse current density is not applicable; frequency ranging from 0 to 1000 Hz; a duty cycle ranging from 5 to 100%; working electrode rotation speed ranging from 0 to 1,000 rpm; bath temperature ranging from 0 to 100° C.; when two or more soluble anodes of different chemical composition from each other are used, average current fraction in each anode ranging from 5% to 95%; bath pH ranging from 0 to 12; bath agitation rate ranging from 1 to 6,000 ml/(min·cm$^2$) anode or cathode area; bath flow direction at cathode ranging from tangential to incident (i.e. perpendicular); shielding anode(s) by physically covering between 0-95% of the geometrical anode surface area(s); and electrochemically inert material concentrations in the bath between 0 and 70 vol %; and modulating at least one of these parameters, e.g. two or more of these parameters, during electrodepositing to cause variation by more than 10% of at least one property in the deposit at least in the deposition direction. The property in the deposit which is varied is selected from the group consisting of grain size, hardness, yield strength, Young's modulus, resilience, elastic limit, ductility, internal or residual deposit stress, stiffness, chemical composition, corrosion rate, coefficient of thermal expansion, coefficient of friction, electrical conductivity, magnetic coercive force, grade thickness, and in the case of metal matrix composites (metallic compositions with particulate therein), volume particulate fraction, particulate particle size, particulate shape and/or particulate chemistry. The method provides a deposit thickness ranging from 20 microns to 5 cm having a fine grained microstructure with grain size ranging from 2 nm to 5,000 nm throughout 1.5 nm to 5 cm of said thickness.

As used herein the terms "product" and "deposit" means deposit layer or free-standing deposit body.

As used herein, the term "thickness" refers to depth in a deposit direction.

As used herein, the term "level" means a portion of thickness of the deposit in a deposit direction.

As used herein, the term "deposit grade" means deposit level or layer.

As used herein the term "average cathode current density" ($I_{avg}$) means the "average current density" resulting in depositing the metallic material and is expressed as the means of the cathodic minus the reverse charge, expressed in mA×ms divided by the sum of the on-time, off-time and reverse time expressed in ms, i.e., $=(I_{peak} \times t_{on} - I_{reverse} \times t_{an})/(t_{on} + t_{an} + t_{off})$; where "x" means "multiplied by".

As used herein the term "forward pulse" means cathodic deposition pulse affecting the metallic deposit on the workpiece and "forward pulse on time" means the duration of the cathodic deposition pulse expressed in ms: $t_{on}$ As used herein the term "off time" means the duration where no current passes expressed in ms: $t_{off}$ As used herein the term "reverse pulse on time" means the duration of the reverse (=anodic) pulse: $t_{an}$ As used herein "electrode area" means the geometrical surface area effectively plated on the workpiece which can be a permanent substrate or a temporary cathode expressed in cm$^2$.

As used herein the term "peak forward current density" means the current density of the cathodic deposition pulse expressed in mA/cm$^2$: $I_{peak}$ As used herein the term "peak reverse current density" means the current density of the reverse/anodic pulse expressed in mA/cm$^2$: $I_{reverse}$ or $I_{anodic}$ As used herein the term "duty cycle" means the cathodic on time divided by the sum of all times (on time, off time and anodic time (also referred to as reverse pulse on time)).

As used herein, the term "deposit stress" means the internal stress of the deposit which can be compressive or in tension and is typically expressed in psi or ksi.

As used herein the term "stiffness" means the resistance of an elastic body to deflection or deformation by an applied force.

As used herein the term "chemical composition" means chemical composition of electrodeposited matrix.

In summary, variations in properties from one grade (level) to a subsequent grade (level) are obtained by modulating at least one parameter selected from average current density, $I_{peak}$, $I_{anodic}$, on time, off time, anodic time (also referred to as reverse pulse on time), frequency, duty cycle, workpiece rotation rate, agitation and flow rate, shielding, temperature, pH, bath composition and particulate bath content and overall plating time. In summary, the resulting deposit properties which can be varied by modulating the deposition conditions include grain size, hardness, yield strength, Young's modulus, resilience, elastic limit, ductility, internal and residual stress, stiffness, chemical composition, thermal expansion, electrical conductivity, magnetic coercive force, thickness and corrosion resistance. Based on the teachings provided, the person skilled in the art will know which parameter(s) to modulate to achieve the desired property variation which is also illustrated in the examples below.

Variation in volume particulate fraction from one grade (level or layer) to a subsequent grade (level or layer) is obtained by modulating inert material additions. Minimum electrochemically inert particulate concentrations suspended in the bath can be, for example 0%, 5% or 10% by volume (vol %). As only particulate suspended in the electrolyte and contacting the cathode will be incorporated into the deposit, agitation rate and flow direction can be used as suitable parameters to change the particulate content in the bath and therefore in the deposit. Maximum electrochemically inert particulate concentration suspended in the bath can be, for example, 50, 75 or 95 vol %. When the agitation rate is reduced, particulates, depending on their density relative to the electrolyte, will either settle at the tank bottom or float at the top and thus not be incorporated in the deposit. Particulate content in the electrolyte in the vicinity of the cathode is modulated to effect a particulate content in the deposit ranging from 0 to 95% by volume.

Variation in particulate particle size, particulate shape and particulate chemistry from one grade (level or layer) to a subsequent grade (level or layer) is obtained by changing inert material additions i.e. filtering out particles for providing one grade (level or layer) and adding particulates for providing another grade (level or layer).

Modulating average cathodic current density and the peak forward current density and peak reverse current density cause a variation in grain size, alloy and metal matrix composition. Increasing average and peak forward current densities typically cause a decrease in grain size.

Modulating forward pulse on time, off time and anodic time (reverse pulse on time) causes variation in grain size, alloy and metal matrix composition. Increasing the on time usually increase grain size, increasing the off time usually results in decreasing grain size and increasing the anodic time usually increases grain size.

Modulating duty cycle, cathode rotation speed, bath composition, pH and agitation rate cause variation in grain size, alloy and metal matrix composition as illustrated in the examples.

Shielding of anode is to shield from 0 to 95% of the anode geometrical area using, i.e., a polypropylene sheet or other electrolyte impermeable foils or membranes.

Modulating inert material addition causes variation in the composition of the deposit as illustrated in the examples.

In summary, variable property electrodeposit can be obtained by suitably adjusting electrodeposition parameters (conditions) during the course of electrodeposition to produce functionally variable property structures to satisfy requirements for components that no single unvaried property material can meet.

DETAILED DESCRIPTION

Figure 1:
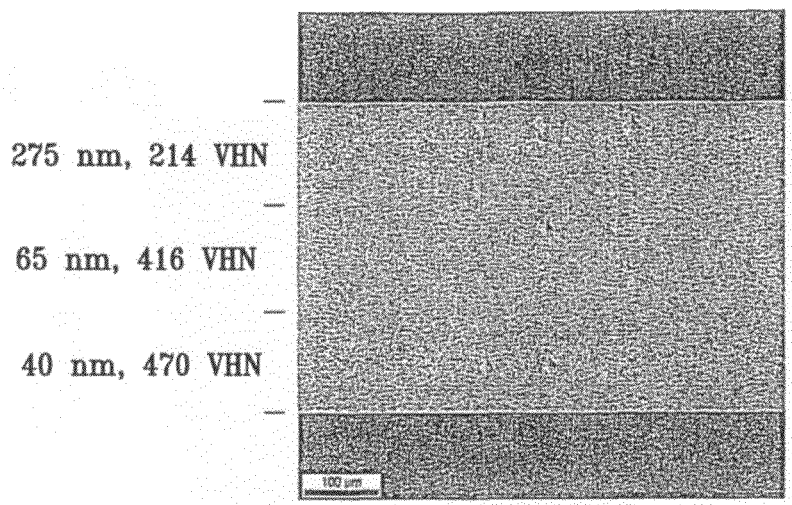
FIG. 1 is a cross-sectional view of result of Working Example I and shows electrodeposited variable property Ni layer consisting of three sections each about 160±10% micron thick) with average grain sizes of 40 nm, 85 nm and 275 nm, respectively (470/416/214VHN) and a stepped variable property profile. The indentations created by the tip of the hardness tester indicative of the different hardness are visible.

A suitable electrolytic cell for use in the method herein is depicted and described in Erb. et al., U.S. Pat. Nos. 5,352,266 and 5,433,797 and Palumbo in U.S. 2005/0205425A1 describes tank, barrel, drum and brush plating set ups for plating fine-grained metallic materials.

The electrolytic cell has an anode or more than one anode and a cathode or more than one cathode and contains an aqueous electrolyte bath containing ions of metallic material to be deposited. The cathode(s) and anode(s) are connected to a source of D.C. or pulsing current which is provided by a suitable power supply. Deposit is on the cathode.

The plating tank or plating cell is equipped with a fluid circulation system.

The anode can be dimensionally stable, e.g. of platinum or graphite, or can be a soluble anode that serves as a source of material to be deposited.

In the case of a free-standing deposit, the cathode is fabricated from a material that facilitates deposit stripping, e.g. titanium and graphite, and is reusable.

In the case of deposit as a layer or coating, the cathode is metal, suitably metallized plastic (polymer) or other material as described later and is therefore used as a permanent substrate.

The process of the invention comprises the steps of positioning a workpiece which is inherently conductive or suitably rendered conductive, i.e., which is to be a permanent substrate to be provided with a layer or coating of electrodeposit as a cathode or relying on a reusable cathode where electrodeposit is to be stripped, in the electrolytic cell, providing electrical connections to the cathode to be plated and to one or more anodes and electroplating a metallic material with a predetermined microstructure and composition on at least part of external surface of the cathode using direct current or direct current with pulsing and modulating operating parameter(s) described above or below to obtain electrodeposit variable property in a deposit direction according to functional property or properties as described above.

Ranges for cathodic current density, forward pulse on time, off time, reverse (anodic) pulse on time, peak forward current density, peak reverse current density, duty cycle, electrode rotation speed, bath temperature, bath composition, bath agitation rate, shielding and inert additions are given above.

Operating parameters include frequency ranging from 0 to 1000 Hz, forward pulse on time ranging from 0.1 to 500 ms, off-times ranging from 0 to 10,000 ms, and reverse pulse on time ranging from 0 to 500 ms.

We turn now in more detail to modulation of process parameters.

Modulation of all electrical parameters, i.e. cathodic current density, forward pulse on time, off time, reverse pulse on time, peak forward current density, peak reverse current density, duty cycle and frequency can be carried out using the power supply.

Modulation of electrode rotation speed can be carried out by using a variable speed motor coupled to the cathode to enable its rotation.

Modulation of bath temperature can be carried out by a heater, i.e. an immersion heater.

Modulation of bath composition can be selectively and reversibly carried out, by one or more steps comprising using a metering pump to add solution (component(s)); adding, removing or modifying selected components using a circulation/bypass loop; using soluble anode with anodic current control to supply ionic species; using soluble anode and a dimensionally stable anode; using two or more soluble anodes of different composition with individual current control in the case of alloy deposit; air agitation to selectively oxidize bath component(s); agitation to control particulate contents; and mixing to affect local ion concentration(s) at the cathode surface.

Modulation of bath pH can be carried out by addition of acid or base.

Modulation of bath agitation rate can be carried out by varying pump speed, flow direction, use of eductors.

Modulation of anode(s) area(s) can be carried out by varying the electrochemically effective, geometrical anode(s) area(s) by shielding.

Modulation of particulate inclusion can be carried out through enhanced bath agitation and as described later.

Property result parameters are listed below.

Minimum thickness of the electrodeposit [μm]: 25; 30; 50

Maximum thickness of the electrodeposit [mm]: 5; 25; 50;

Minimum thickness of a fine-grained sublayer [nm]: 1.5; 25; 50

Maximum thickness of a fine-grained sublayer [μm]: 50, 250, 500

Minimum average grain size [nm]: amorphous (i.e. no grains but glassy structures); 2; 5

Maximum average grain size [nm]: 250; 500; 1,000; 5,000; 10,000; 250,000

Minimum stress of the sublayer or the electrodeposited layer (in tension or compression) [ksi]: 0; 1; 5

Maximum stress of the sublayer or the electrodeposited layer (in tension or compression) [ksi]: 25; 50; 200

Minimum ductility of the electrodeposit [% elongation in tension]: 0.5; 1; 2.5

Maximum ductility of the electrodeposit [% elongation in tension]: 5; 15; 30

Hardness [VHN]: 50-2,000

Yield strength [MPa]: 100-3,000

Young's modulus [MPa]; 50-300

Resilience [MPa]: 0.25-25 elastic range [%]: 0.25-2.5, coefficient of thermal expansion [ppm/K]:0-50 coefficient of friction: 0.01-1 electrical resistivity [micro Ohm-cm]: 1-100

Deposition rates used are at least 0.001 mm/hr, preferably at last 0.01 mm/hr and more preferably at least 0.10 mm/hr.

As used herein, the term "deposit direction" means the direction of current flow between anode and cathode in the electrodepositing cell and the resulting build-up in the electrodeposited layer on the cathode and if the cathode is a flat plate the direction of deposit is perpendicular to the cathode.

We turn now to the metallic materials that are electrodeposited.

In one case the metallic material is a metal selected form the group consisting of Ag, Au, Cu, Co, Cr, Mo, Ni, Sn, Fe, Pd, Pb, Pt, Rh, Ru and Zn. In other words, electrodepositing pure metal to obtain a variable property product is an option unlike in the case of Detor U.S. 2006/0272949 and is illustrated in Working Example 1.

In another case the metallic material is an alloy of one or more elements selected from the group consisting of Ag, Au, Cu, Co, Cr, Mo, Ni, Sn, Fe, Pd, Pb, Pt, Rh, Ru and Zn and optionally one or more elements selected from the group consisting of B, P, C, Mo, S and W; wherein a binary alloy in which an element is Ni, Fe, or Co, the other element is not W, Mo or P; and wherein in a binary alloy in which an element is Ni, the other element is not Fe; and wherein in a binary alloy in which one element is Co, the other element is not Zn; and wherein in a binary alloy in which one element is Cu, the other element is not Ag; and wherein in a binary ally in which one element is Cr, the other element is not P; and wherein the ternary alloys Ni—W—B and Co—Ni—P are excluded.

In still another case, the metallic material contains:

(i) one or more metals selected from the group consisting of Ag, Au, Cu, Co, Cr, Mo, Ni, Sn, Fe, Pd, Pb, Pt, Rh, Ru and Zn;

(ii) at least one element selected from the group consisting of C, O and S; and (iii) optionally at least one or more elements selected from the group consisting of B, P, Mo and W. Group (ii) elements are provided in the range of 10 ppm to 5%, group (iii) elements in the range of 500 ppm to 25%, the balance being group (i) elements which typically range from 75% to 99.9%.

We turn to a case where the electrodeposit is of metallic material containing particulates, i.e., of metal matrix composite. The metallic material is as described above. Suitable particulate additives for preparing metal matrix composites include metals (Ag, Al, Cu, In, Mg, Si, Sn, Pt, Ti, V, W, Zn) powders; metal alloy powders; metal oxide powders of Al, Co, Cu, In, Mg, Ni, Si, Sn, V and Zn; nitrides of Al, B and Si; carbon (graphite powder, carbon powder, graphite fibers, Buckminster fullerenes, carbon nanotubes, diamond); carbides of B, Cr, Bi, Si, W; glass, organic materials including polymers such as polytetrafluoroethylene, polyethylene, polypropylene, acrylonitrile-butadiene-styrene copolymer, polyvinyl chloride, epoxy resins. The particulate average particle size is typically below 10,000 nm (10 μm). More preferably, below 500 μm, still more preferably below 100 μM.

In the case where product contains particulates, the particulates are part of the plating bath and are deposited with the metallic material. In other words, metal matrix composites are electrodeposited. The particulate components do not participate in electrochemical reduction as is the case with the metallic components and simply get incorporated into the electrodeposited deposit by inclusion. For grading, the following applies. The volume content of particulates can be controlled for a subsequent grade by adding a higher concentration of particulates to the bath to increase particulate concentration in the bath, or by decreasing concentration of particulates in the bath, e.g., by filtering of particulates to lower the volume of particulates in a following electrodeposit. Alternatively, agitation rates and/or flow patterns can be used to control the amount of particulates suspended in the bath, with higher agitation rates generally resulting in increased particulate contents in the deposits.

We turn now to where the electrodeposit is for a free-standing form. The free-standing form is stripped from strippable cathode such as a titanium cathode as described above. The utility of free-standing form is, for example, for electroformed articles such as foils, plates, tubes and complex shaped articles.

We turn now to where the electrodeposit is as a layer or coating on a substrate. In this case the permanent substrate is the cathode.

Suitable permanent substrates include a variety of metal substrates (e.g. all steels; metals and alloys of Al, Cu, Co, Ni, Fe, Mo, Pt, Ti, W and Zr), carbon-based materials-based (e.g. carbon, diamond, graphite, graphite fibers and carbon nanotubes) substrates; and polymer substrates. Suitable polymeric materials for polymeric substrates include filled epoxy resin composite material, unfilled epoxy resin, polyamide, mineral filled polyamide resin composites, polyvinyl chloride (PVC), thermoplastic polyolefins (TPOs), polytetrafluoroethylene (PTFE), polycarbonate and acrylonitrile-butadiene-styrene (ABS). Suitable fillers for the filled epoxy resin composites included glass fibers, carbon, carbon nanotubes, graphite, graphite fibers, metals, metal alloys, ceramics and mineral fillers such as talc, calcium silicate, silica, calcium carbonate, alumina, titanium dioxide, ferrite, and mixed silicates (e.g. bentonite or pumice), and are present in amount up to 70% by weight. Mineral-filled polyamide resin contains powdered (e.g. 0.2-20 microns) mineral fillers such as talc, calcium silicate, silica, calcium carbonate, alumina, titanium dioxide, ferrite and mixed silicates (e.g. bentonite or pumice) and mineral contents of up to about 40% by weight and provides high strength at relatively low cost.

We turn now to cases where coatings or layers are electrodeposited and are anchored into at least part of a complex, perforated or porous structure, e.g., a foam, a felt, clothes, or a perforated plate or are infiltrated into at least part of a solid structure, to grade the structure (e.g., the composition and porosity) of the resulting article. The solid structures include, for example, cores for sandwich panels, energy absorbing structures i.e. crash boxes for automobiles such as bumpers, energy absorbing layers in multi-component body and vehicular armors or applications requiring blast protection from mines and the like. The porous structures include random cellular foams (e.g. reticulated carbon open cell foam coupons) and periodic cellular architectures (e.g. honeycombs). This is illustrated in Working Example IX and FIG. 5.

Where substrate to be provided with an electrodeposited layer or coating is poorly conductive or nonconductive, it can be metallized to render it sufficiently conductive for plating, e.g. by applying a thin layer of conductive material, e.g. by electroless deposition or by applying an electrically conductive paint. Thus the subject invention encompasses providing layer or coating to virtually any substrate material.

The variable property electrodeposit can be suitably exposed to a finishing treatment, which can include, among others, electroplating, i.e., chromium plating and applying a polymeric material, i.e., a paint or adhesive.

We turn now to benefits of and utility for the invention.

It is noted that the invention requires a single electrolytic cell system, i.e. a single plating tank. Benefits of this include elimination of washing steps when substrates are moved from plating tank to plating tank, reducing water cost and eliminating the drag out/cross contamination issue which is significant particularly when complex shaped parts are plated retaining electrolyte in grooves, cups and cavities which do not drain on removal of part from plating tank. Benefits also include no need to use several deposition setups and no need for sequential application of distinct layers by moving the substrate form tank to tank as commonly employed in fabricating laminates or achieving variable property properties by simultaneously employing two processes or by employing plural post treatments.

Variable property metallic material electrodeposits containing at least in part a fine-grained microstructure provide superior overall mechanical properties compared to monolithic fine-grained (average grain size of 2 nm-5 microns), entirely coarse-grained (average grain size>20 microns) or entirely amorphous metallic material deposits, e.g. the surface benefits of fine-grained deposit of high hardness (high wear resistance), high resilience to provide a high degree of elastic deformation; the high ductility and improved corrosion performance benefits of coarse-grained metallic deposits, and/or the high hardness, high wear resistance and lack of intergranular corrosion benefits of amorphous microstructure of no porosity.

Numerous applications benefit from different properties in different sections/locations of a part. As an example, a complex part such as an artificial hip joint can require different properties in different sections of the part, e.g. the ball joint surface needs to have high hardness to reduce wear (achievable by grain refinement and/or metal matrix composite grade, i.e. level or layer) and to be lubricious (achieved by use of suitable particulates, e.g. graphite, diamond, quasicrystalline metals or organic compounds in a metal matrix composite grade) for ease of movement, while the stem should be more ductile and rough and porous at an outer surface to enable bone in-growth. This is preferably achieved for the ball joint by employing a smooth coating employing grain refinement at an outer surface and/or by inclusion of particulates to form a metal matrix composite in the outer surface. This can be accomplished in the stem by modulating the grain size, deposit and particulate composition. Similarly, many industrial parts such as molds, gun barrels, automotive parts and sporting goods, within the scopes of the invention herein, have grades (levels or layers) and/or areas requiring different properties, that is, grades with high hardness, grades (levels or layers) with high lubricity and grades with good ductility. The high hardness and high lubricity are for an outer grade and the good ductility is for an inner grade.

The deposition direction variable property approach is particularly suitable when a fine-grained layer exhibits significant internal stress and/or brittleness and when applied as a coating tends to crack and/or delaminate from a substrate or in the case of free standing structures crack and disintegrate upon forming or forming in use (i.e. bending or tension). This is accommodated for by the invention herein by also providing grade or grades (levels or layers) with different microstructures, ranging from an amorphous section of essentially no ductility via fine-grained sections of limited ductility to coarse-grained section of high ductility.

Particular examples of this problem follow.

A specific example of a fine-grained deposit that exhibits significant internal stress and are highly brittle when deposited in fine-grained form is an iron deposit. When iron is electrodeposited in nanocrystalline form, it is highly stressed. Typically internal stress values observed range between 10-100 ksi (tensile) for a plate with a hardness value of 550-650 VHN. High residual stress adversely impacts achievable thickness and results in a microstructure that is either micro-cracked or too stressed to accommodate any significant amount of plastic deformation in service, that is extremely hard but exhibiting poor toughness. These deficiencies cannot be accommodated for by heat treatment since likely due to impurities introduced during electrodepositing (e.g. 0, C. S and H), a resulting deposit embrittles upon heat treatment. These deficiencies preclude the use of fine-grained bearing structural applications. These deficiencies are accommodated for by also providing a grade or grades (levels or layers) with alternating ductile and brittle layers as illustrated in Working Example XI Other "high stress" metallic deposits include fine-grained electrodeposits of Pt, Pd, Rh and Cr where cracking in deposits is a problem. Variable property structure also including, for example, levels or layers of alternating highly stressed and low stressed layers enables the build up of thick deposits provided by the invention herein, provide both high strength and acceptable overall internal stresses so that cracking is not induced in the electrodeposit as a whole.

Other circumstances that benefit from varying properties by the invention herein include the incorporation of amorphous or quasi-crystalline grade (level or layer), which are known to provide significant hardness at the expense of ductility, together with alternating or underlying layers of ductile deposits (e.g. coarse grained layers) to provide high overall hardness and acceptable overall ductility so that cracking is not induced in the electrodeposit as a whole as soon as the article is exposed to a small degree of bending or deformation. In addition to their high hardness amorphous metallic materials lack intergrannular corrosion therefore i.e. amorphous Ni—P or Co—P outer layers provide for excellent corrosion protection. Quasicrystalline metals, much like fine-grained metallic materials exhibit a low coefficient of friction and are therefore suitable "skins" or outer layers in applications requiring low friction, i.e., involving moving parts sliding against each other as occurs in combustion engines, electric motors, hydraulic components, automotive or industrial shocks, actions in firearms etc.

Parts made from or coated with variable property materials, which are fine-grained in whole or in part, made by the invention as disclosed herein, are particularly useful for components requiring great dimensional stability over a wide operating temperature range and are not prone to cracking, spalling or delamination. The electrodeposition process herein is particularly suitable for synthesizing stiff, strong, tough, ductile, lightweight, wear and corrosion resistant freestanding parts and coatings and layers of low internal stress.

When used as coatings on substrates of similar chemistry, the coefficient of thermal expansion (CTE) between the coating and the permanent substrate can be closely matched by grading according to the invention described herein to prevent delamination during repeated temperature cycling, as the CTE is dictated by the chemical composition of the part and relatively unaffected by changes in the grain size. In the case of free-standing parts (not utilizing a permanent substrate) minimizing dimensional changes within the operating temperature range of interest (−80° C. to 600° C.) can be achieved by grading (varying properties between levels or layers) according to the invention herein.

In a number of applications, e.g. the aerospace field, the dimensional stability of articles with critical dimensions which do not change over the operating temperature range, are vital. Among metals and alloys selected, nickel-iron alloys (e.g. Invar®, an alloy containing about 36% by weight of nickel and 64% by weight of iron) provide unusually low CTEs. Traditionally such articles are machined from cast or rolled alloy feedstock metal. This approach is expensive and time-consuming, and very inefficient. Electroforming or suitably coating such articles by electrodepositing alloys of nickel is known. This invention enables the fabrication of articles using CTE matching, providing the added strength through a grain refined grade and enables grading (varying properties between levels or layers) to e.g. further enhance the surface hardness, strength, etc., as required.

The variable property and multilayered-electrodeposition process herein is also suited for the repair of worn surfaces and enables the refurbishment of parts by selectively coating, e.g., worn areas or the entire part with a layer of similar chemistry but, e.g., grading to provide grade with small grain size, to enhance wear performance and increase the service life.

Articles made according to the variable property and/or layered electrodeposition process of this invention find use in a variety of applications requiring durable, light-weight, high-strength layers or coatings that provide improved reliability, durability and performance characteristics. Applications include automotive components, aerospace parts, defense parts, consumer products, medical components and sporting goods. Suitable industrial parts include, among others, rods, rolls, tubes or shafts used, e.g., in industrial applications such as in continuous-process manufacturing equipment, hydraulic equipment and the like; sporting goods such as ski and hiking poles, fishing rods, golf club shafts, hockey sticks, lacrosse sticks, baseball/softball bats, bicycle frames; plates such as golf club head face plates; as well as complex shapes such as sports racquets (tennis, racquetball, squash and the like), golf club heads, automotive parts such as grillguards; running boards; spoilers; muffler tips, wheels, vehicle frames, structural brackets, and carbon fiber composite (CFC) molds. Consumer products include electronic appliances such as walkman, discman, MP3 players, cell phones and blackberries, cameras and other image recording devices as well as TVs. Parts are at least partially coated on or within their structure to contain variable property metallic materials by the invention herein. For example, electrodepositing can be onto a substrate of an orthopedic prosthesis, gun barrel, mold, sporting good or automotive component.

Varying the particulate content, particulate particle-size and shape and/or particulate chemistry between levels or layers by process of the invention herein can be performed in order to control a particle-dependent mechanical property such as wear resistance, or may alternatively be carried out in order to vary the coefficient of thermal expansion (CTE) of the electrodeposited metal matrix composite.

The present invention can be employed to periodically alternate layers of soft, low internal stress metal deposits with harder, higher stressed deposited layers of the same metal. The overall "bulk" mechanical properties depend, at least in part, upon the interlayer spacing according to a Hall-Petch relationship and this approach optimizes the overall macroscopic material physical and mechanical properties (i.e. strength, ductility, toughness) via optimization of the microstructure.

In use of the invention herein, alternation between metallic layers at least 1.5 nm thick between fine and coarse grain sizes and high and low stress values by modulating the electrodeposition conditions in a single plating bath is carried out to overcome the inherently high internal stress of monolithic fine-grained deposits while still maintaining a high level of mechanical strength thereby relying on the coarser grained/softer metal layers to reduce the overall macroscopic plating stress, while relying on the high strength metal layers to achieve excellent overall mechanical properties.

The working examples herein show modulation of the following parameters to provide variable property electrodeposits: cathodic current density (Working Examples I, II), plural different composition soluble anodes with anodic current fraction modulation (Working Example IV and V and X), pulse parameters (Working Examples I, VIII, XI and XIII), cathode rotational speed (Working Example III), bath deposition rate (Working Example IX), bath agitation condition (Working Example V), bath composition (Working Example VII), variation in flow direction at cathode (Working Examples VI and XII), inert material additions (Working Example VII) and shielding (Working Example XIII).

In a use of the invention herein there is provided alternation between crystalline and amorphous and/or quasi-crystalline levels or layers to provide benefits of overall mechanical and chemical properties which cannot be achieved by a monolithic uniform material.

By the invention herein metallic coating can be applied to a part made substantially of the same chemistry to achieve excellent metallurgical bonding between a coating or layer and a substrate and also refined grain size toward outer surface to enhance a physical property selected from the group of lubricity, hardness, strength toughness and wear resistance.

In one alternative, the invention herein provides articles with varied grain sizes, internal stresses and/or brittleness that do not crack and/or delaminate from a substrate during preparation or during use.

In one alternative, the invention herein provides articles with varied grain sizes that are strong, tough, hard and wear and abrasion resistant as well as lightweight.

In an alternative, the invention herein provides metal, metal alloy or metal matrix composite coatings or layers with change in the grain size and/or crystallographic textures in one or more grades (levels or layers) to enhance at least one property selected from the group consisting of internal stress, strength, hardness, toughness, ductility, coefficient of friction, scratch resistance and wear resistance due to varying composition and microstructure between levels and/or layers.

In an alternative, the invention herein provides articles and coatings with particulate matter therein by process comprising initially electrodepositing on a substrate of a given chemistry a layer or coating of the same chemistry to achieve an excellent metallurgical bond and to match the physical properties (e.g. coefficient of thermal expansion) of the coating or layer to those of a substrate and thereafter introduce particulate matter into the plating bath to effect a deposition of a metal matrix composite to achieve an outer layer containing a volume fraction of particulates effective to enhance wear performance.

In another alternative, the invention is used to provide a variable property coating of metal and/or metal alloy and/or metal matrix composite on the inside or outside of a tube, e.g. to grade coat a gun barrel, e.g. gun barrel inner surface, e.g. using a nanocrystalline-NiW-diamond composite or nanocrystalline-CoP-diamond metal matrix composite, i.e. where the particulates are diamond particles, to improve resistance to cracking, spalling and erosive wear, particularly near the chamber as part of a variable property layer that remains hard, wear resistant and of maximum obtainable thermal stability, throughout the service life, along with a thermal shock response that is close to that of the steel substrate barrel inner surface (matching coefficient of thermal expansion, Young's modulus, strength and ductility).

In an alternative, the invention herein provides variable property coating with outer lubricious surface for one or all sliding surfaces of selected parts, i.e. to hydraulic components or sliding mechanisms of parts such as actions of automated and semi-automated rifles with metal, alloy or metal matrix grades, e.g. metal matrix composites with nanocrystalline-NiW-BN or nanocrystalline-CoP-BN inclusions also containing diamond particulates, to improve the coefficient of friction of said outer surface as well as wear performance and longevity of said outer surface.

Where a metal matrix composite containing variable property layer is provided, variable property variation in particulate content, particulate particle size and shape and/or particulate chemistry can be carried out to control particle-dependent mechanical property such as wear resistance or can be alternatively carried out to vary coefficient of thermal expansion of metal matrix composite.

The instant invention provides for variable property coatings, layers or free-standing articles for applications including sporting goods (golf clubs and shafts, hockey sticks, baseball bats, tennis racquets, skiing and snowboarding equipment, boards and coatings on complex shapes, e.g. skate boards), medical devices (surgery tools, stents, orthopedic prosthesis parts and hp implants), automotive and aerospace applications, consumer products (electronic equipment, phones, toys, appliances, tools), commercial parts (gun barrels, molds).

In a subsequent step, parts containing the variable property coatings or layers can be subjected to other finishing operations as required including, but not limited to, polishing, waxing, painting, plating i.e. Cr-plating.

According to this invention, patches or sections can be formed on selected areas of articles, without the need to coat the entire article e.g. utilizing selective deposition techniques such as, but not limited to, part repair and refurbishment.

We turn now to where the electrodeposit not only is provided with variable property in the deposit direction but also within (i.e. along the width or length of) the deposit, i.e. electrodepositing parameters are modulated to cause variation by more than 10% in at least one property not only along the depth of the deposit but along its length and width. This can be referred to as multidimension electrodeposit grading.

In this case the properties of the electrodeposit are changed in the deposit direction but also changed along length and/or width of the deposit by modulating the deposit parameters (conditions in a plating tank).

Multidimension grading is particularly suitable if, without this a fine grained layer exhibits significant internal stress and/or brittleness and when applied as a coating or layer cracks and/or delaminates from a substrate and in the case of free standing structures which crack and/or disintegrate upon forming or deforming in use (i.e. upon bending or when under tension).

Multidimension grading can be carried out, for example, in an electrolytic cell as previously described equipped with a recirculation loop with means to enable variation of flow rate so as to provide different bath composition as a function of distance from the center of the deposit thereby grading throughout a coating grade. This is exemplified in Working Examples XII and XIII. Other ways of carrying this out include anode shielding, and/or placing one of the several anodes in closer proximity to an area to be varied in property.

Turning again to where operating parameters are modulated to produce grades of different grain size, this can effect grading of other properties in addition to grain size. This is illustrated for nickel in Table 1 below.

TABLE 1

Variation in Properties of Nickel Due to Variation in Grain Size

|  | 20 nm grain size | 100 nm grain-size | 30 micron grain size |
| --- | --- | --- | --- |
| Hardness [VHN] | 600 | 350 | 120 |
| Elongation in tension [%] | 2 | 16.7 | 30 |
| Corrosion Rate (determined in a potentiostatic test in 2N H2SO4); current in the passive region (500-1000 mV vs SCE) [mA/cm$^2$] | 1 |  | 0.1 |

Further explanation of how changing grain size of nickel affects physical properties follows: The hardness increases from 120 VHN (for conventional grain sizes greater than 5 microns) to 350 VHN (grain size of 100 nm) and ultimately to 600 VHN (grain size 20 nm). The wear rate for dry pin-on-disc decreases from 1,330 µm$^3$/µm for conventional nickel to 7.9 µm$^3$/µm for nickel with a grain size of 10 nm.

The invention is illustrated in the following Working Examples carried out in a tank as described above equipped with an electrolyte recirculation loop.

WORKING EXAMPLE I

Grading of Ni Electrodeposit to Grade Grain Size and Hardness in the Deposit Direction with Electrodeposition Condition Modulation Free-standing Ni-layers with variable property and multilayered grain size were electrodeposited on a polished Ti cathode (10 cm$^2$) in a modified Watts nickel bath (40 l tank) using grain refiners, levelers, brighteners, stress relievers and chelating agents (Integran Technologies Inc., Toronto, Ontario, Canada). Nickel "R"-rounds (Inco Ltd., Sudbury, Ontario, Canada) were used as anode material. NPA-91 is provided by Atotech USA (Rock Hill, S.C.). The plating current was supplied by a Dynatronix (Amery, Wis., USA, Dynanet PDPR 40-100-400) pulse power supply. The electrolyte and the electroplating conditions used are indicated in Table 2. The variation in grain size of the metallic layers was achieved by modulating the electroplating conditions as set forth in Table 2. Resulting variable property structure is shown in FIG. 1. FIG. 1 shows a cross-section of the electrodeposited Ni after removal from the temporary substrate, showing grain size change thereof. The sample was embedded in epoxy, cross-sectioned, polished and hardness tested before the image was recorded.

TABLE 2

Bath Chemistry and Electrodeposit Conditions Used to Electrodeposite a Free Standing Ni Plate with Three Distinct Layers of Different Grain Size in the Deposit Direction

| Bath Chemistry | |
|---|---|
| 300 g/l | NiSO$_4$•6H$_2$O |
| 45 g/l | NiCl$_2$•6H$_2$O |
| 45 g/l | H$_3$BO$_3$ |
| 5 ml/l | NPA-91 |
| 2 g/l | Sodium Saccharinate chelating agents, stress relievers |

| Plating Conditions | |
|---|---|
| Electrolyte Temperature: | 60° C. |
| pH: | 2.5 |
| Electrolyte Agitation Rate (normalized for cathode area): | 20 ml/(min · cm$^2$) |
| Rotation Speed [RPM]: | 0 |
| Bath Flow Direction: | tangential |
| Particulate Bath Content (in suspension): | N/A |
| Multiple Anodes: | N/A |
| Anode Shielding: | N/A |

| Variable property and multilayered Settings | 1 | 2 | 3 |
|---|---|---|---|
| Average Current Density (I$_{avg}$) [mA/cm$^2$] | 50 | 80 | 80 |
| Peak Forward Current Density [mA/cm$^2$] | 89 | 320 | 320 |
| Forward Pulse On Time [ms] | 90 | 8 | 2 |
| Off Time [ms] | 0 | 24 | 6 |
| Reverse Pulse On Time [ms] | 10 | 0 | 0 |
| Reverse Pulse Peak Current Density [mA/cm$^2$] | 300 | N/A | N/A |
| Total cycle time [ms] | 100 | 32 | 8 |
| Frequency [Hz] | 10 | 31 | 125 |
| Duty Cycle [%] | 90 | 25 | 25 |
| Plating Time [min] | 300 | 105 | 105 |
| Layer Thickness [μm] | 165 | 145 | 160 |
| Material Properties | | | |
| Hardness (VHN) | 214 | 416 | 470 |
| Average Grain Size [nm] | 275 | 85 | 40 |

The electrodeposit is useful for articles requiring high overall strength with high hardness on one outer surface and low hardness on the other outer surface and the grading provides these benefits in an elegant way.

WORKING EXAMPLE II

Variable Property Nano-Ni—Fe Electrodeposit to Simultaneously Grade Deposit Chemical Composition and Grade Grain Size in the Deposit Direction with Current Density Modulation Aluminum open-cell porous foam blocks 2×0.5×1" (20 pores per inch, ERG Materials and Aerospace Corp., Oakland, Calif., USA) were filled by coating with fine-grained Ni—Fe by placing the foam substrates as cathodes in a plastic frame to expose the frontal area only to the electrolyte and subjected to the plating conditions indicated in Table 3. A modified Watts nickel bath adapted for Ni—Fe alloy plating (Integran Technologies Inc., Toronto, Ontario, Canada) was placed in a 40 liter tank and a Dynatronix (Amery, Wis., USA, Dynanet PDPR 40-100-400) pulse power supply was employed. The electrolyte composition used is provided in Table 3 below. A soluble Ni anode was employed (Inco Ltd., Sudbury, Ontario, Canada) and the Fe concentration replenished continuously at a rate to maintain the Fe concentration constant. This is carried out by a "person skilled in the art" appropriately use a metering pump and using an iron salt solution to maintain the Fe concentration in the bath substantially constant. The electrical plating conditions were varied, to continuously vary the alloy composition of the coating by ramping up the average current density from 0 to 20 mA/cm$^2$ at a rate of about 2 mA/(cm$^2$.h). Table 3 also shows grain size and alloy composition in three grades.

TABLE 3

Bath Chemistry and Electrodeposit Conditions Used to Electrodeposit a Variable property Ni—Fe Alloy Plate

| Bath Chemistry | |
|---|---|
| 260 g/l | NiSO$_4$•6H$_2$O |
| 45 g/l | NiCl$_2$•6H$_2$O |
| 8 g/l | FeCl$_2$•4H$_2$O |
| 45 g/l | H$_3$BO$_3$ |
| 46 g/l | Sodiumcitrate (2H$_2$O) |
| 2 g/l | Sodium Saccharinate |
| 2.2 ml/l | NPA-91 |
| Iron Feed Formulation | |
| 11 g/l | FeCl$_2$•4H$_2$O |
| Rate of Addition: | adjusted to maintain a constant Fe concentration in the bath |

| Plating Conditions | |
|---|---|
| Electrolyte Temperature: | 65° C. |
| pH: | 2.2 |
| Electrolyte Agitation Rate (normalized for cathode area): | 40 ml/(min · cm$^2$) |
| Deposition Time: | 10 hrs |
| Average Current Density Ramp Up Rate: | 2 mA/(cm$^2$.hr) |
| Forward Pulse On Time [ms]: | N/A |
| Off Time [ms]: | N/A |
| Reverse Pulse On Time [ms]: | N/A |
| Reverse Pulse Peak Current Density [mA/cm$^2$]: | N/A |
| Total Cycle Time: | N/A |
| Frequency [Hz]: | 0 |
| Duty Cycle: | 100% |
| Rotational Speed [RPM]: | 0 |
| Bath Flow Direction: | perpendicular |
| Particulate Bath Content: | N/A |
| Multiple Anodes: | N/A |
| Anode Shielding: | N/A |

TABLE 3-continued

Bath Chemistry and Electrodeposit Conditions
Used to Electrodeposit a Variable property Ni—Fe Alloy Plate

| Grading Settings | 1 | 2 | 3 |
|---|---|---|---|
| Average Geometric "Frontal Area" Current Density [mA/cm$^2$] | 2 | 16 | 20 |
| Material Properties | | | |
| Ni Content [%] | 95 | 75 | 63 |
| Fe Content [%] | 5 | 25 | 30 |
| Average Grain Size [nm] | 15 | 15 | 15 |

The variable property electrodeposited Ni—Fe Plate is useful for applications where high strength and stiffness is required which benefits from a higher Fe content while the outer surface is exposed to ambient conditions and corrosion is a concern, and the corrosion rate is reduced by lowering the Fe concentration in a Ni—Fe alloy in the exposed outer surface. Furthermore, an increase in "average" Fe content of the electrodeposit substantially reduces the cost of the coating, i.e., in October 2007 the cost for Ni LME metal amounted to USD 15.- per pound, whereas the cost for electrolytically pure Fe bulk was about USD 1.50 per pound. For instance if 10% of Ni in a pure Ni deposit is replaced by Fe, the deposit metal cost is decreased by 9%, if the average Fe content is increased to replace 25% of the bulk Ni, the cost savings amount to ~23%. Specific applications include high strength, lightweight energy absorbing structures such as crash boxes built into automobile parts, i.e., into bumpers.

WORKING EXAMPLE III

Electrodepositing Variable Property Nanocrystalline-Ni—Fe Electrodeposit on Graphite/Epoxy Golf Shaft with Cathode Rotational Speed Modulation A graphite/epoxy golf shaft with an outer diameter of about ½" was placed on a suitable mandrel. The mandrel was inserted in a rotator equipped with a variable rotation speed motor, submersed into the electrolyte and subjected to the plating conditions indicated in Table 4. The modified Watts nickel bath outlined in Working Example II adapted for Ni—Fe alloy plating (Integran Technologies Inc., Toronto, Ontario, Canada) was placed in a 40 liter tank and a Dynatronix (Amery, Wis., USA, Dynanet PDPR 40-100-400) pulse power supply was employed. Soluble Ni-rounds (Inco Ltd., Sudbury, Ontario, Canada) and electrolytic Fe rounds (Allied Metals Corp. of Troy, Mich.) were employed as anodes. NPA-91 is provided by Atotech USA (Rock Hill, S.C.). The golf club shaft was the cathode. The plating conditions were varied, to continuously vary the alloy composition of the coating by reducing the rotational speed of the tube from 400 RPM to 120 RPM at a rate of about 100 RPM/hr at a current density of 150 mA/cm$^2$. Table 4 shows bath chemistry, and operating and the alloy composition and grain size at three distinct RPM settings. Table 4 follows:

TABLE 4

Bath Chemistry and Electrodeposit Conditions Used to Electrodeposit a Variable property Ni—Fe Plating on a Graphite/Epoxy Golf Shaft

| Bath Chemistry | |
|---|---|
| 260 g/l | NiSO$_4$•6H$_2$O |
| 45 g/l | NiCl$_2$•6H$_2$O |
| 8 g/l | FeCl$_2$•4H$_2$O |
| 45 g/l | H$_3$BO$_3$ |
| 46 g/l | Sodiumcitrate (2H$_2$O) |
| 2 g/l | Sodium Saccharinate |
| 2.2 ml/l | NPA-91 |

| Plating Conditions | |
|---|---|
| Average Current Density: | 150 mA/cm$^2$ |
| Forward Pulse On Time [ms]: | N/A |
| Off Time [ms]: | N/A |
| Reverse Pulse On Time [ms]: | N/A |
| Reverse Pulse Peak Current Density [mA/cm$^2$]: | N/A |
| Total Cycle Time: | N/A |
| Frequency [Hz]: | 0 |
| Duty Cycle: | 100% |
| Bath Flow Direction: | tangential due to cathode rotation |
| Particulate Bath Content: | N/A |
| Multiple Anodes: | N/A |
| Anode Shielding: | N/A |
| Electrolyte Temperature: | 65° C. |
| pH: | 2.2 |
| Pump Induced Electrolyte Agitation Rate (normalized for cathode area) [ml/(min · cm$^2$)]: | 0 |
| Deposition Time: | 30 min |
| Deposition Rate: | 0.160 mm/hr |
| Rotational Speed Ramp Up Rate: | 100 RPM/hr |

| Cathode Grading Settings | 1 | 2 | 3 |
|---|---|---|---|
| Cathode Rotational Speed [RPM] | 400 | 200 | 120 |
| Material Properties | | | |
| Ni Content [%] | 71 | 77 | 86 |
| Fe Content [%] | 29 | 23 | 14 |
| Average Grain Size [nm] | 15 | 15 | 15 |

The variable property coating provides strength and resilience and wear protection to the golf shaft and, as the Fe content in the outer surface is reduced, provides a corrosion rate advantage compared to an unvaried property Ni-29Fe alloy coating.

WORKING EXAMPLE IV

Grading of Nanocrystalline Ni—Fe Electrodeposit with Modulation of Anode Current Fraction A nanocrystalline Ni—Fe layer with a variable property composition was electrodeposited on a 310 cm$^2$ section of a carbon fiber epoxy(CFC) mold (CTE: 1×10$^{-6}$ C$^{-1}$) (functioning as a cathode) in a modified Watts nickel bath adopted for Ni—Fe alloy plating (Integran Technologies Inc., Toronto, Ontario, Canada) and using a Dynatronix (Amery, Wis., USA, Dynanet PDPR 40-100-400) pulse power supply. A 40 liter tank was used. The electrolyte composition used is provided in Table 5 below. A soluble Ni anode and a soluble Fe anode were employed, the two soluble anodes were connected to separate power supplies to enable the individual control of the anodic currents. The negative leads of both power supplies were connected to the CFC cathode. Standard levelers, brighteners, stress relievers and chelating agents were employed. Conventional Ti-wire mesh anode baskets were employed. Ni "R"-rounds (Inco Ltd., Sudbury, Ontario, Canada) were used to fill the Ni anode basket and electrolytic Fe rounds (Allied Metals Corp. of Troy, Mich.) were used for the soluble iron electrode. The electroplating conditions and metallic layer properties used are summarized in Table 5 below. The data indicate that adjusting the relative Ni/Fe anode current densities can be used to control the chemical composition of the NiFe-alloy deposit to match the CTE of the substrate with the one of the near substrate layer. Similar results were achieved when metal salt solution additions were used to continuously or abruptly change the bath composition. Table 5 follows:

TABLE 5

Bath Chemistry and Electrodeposit Conditions for Variable property Ni—Fe Electrodeposit on Carbon Fiber/Epoxy Mold Substrate with Anodic Current Fraction Modulation Bath Chemistry

| | |
|---|---|
| 45 g/l | $NiCl_2 \cdot 6H_2O$ |
| 25 g/l | $FeSO_4 \cdot 4H_2O$ |
| 45 g/l | $H_3BO_3$ |
| 4 ml/l | NPA-91 |
| 4 g/l | Sodium Saccharinate chelating agents, stress relievers |

Plating Conditions

| | |
|---|---|
| Temperature: | 60° C. |
| pH: | 2.5 |
| Electrolyte Agitation Rate (normalized for cathode area): | 50 ml/(min · cm$^2$) |
| Bath Flow Direction: | tangential |
| Rotation Speed [RPM]: | 0 |
| Forward Pulse On Time [ms]: | N/A |
| Off Time [ms]: | N/A |
| Reverse Pulse On Time [ms]: | N/A |
| Reverse Pulse Peak Current Density [mA/cm$^2$]: | N/A |
| Total Cycle Time: | N/A |
| Frequency [Hz]: | 0 |
| Duty Cycle: | 100% |
| Particulate Bath Content: | N/A |
| Multiple Anodes: | yes, per grading settings below |
| Anode Shielding: | N/A |

| Grading Settings | 1 | 2 |
|---|---|---|
| Total Average Cathodic Current Density [mA/cm$^2$] | 63.2 | 79.4 |
| Total Current Ni-Anode Current [A] | 8.0 | 13.0 |
| Total Current Fe-Anode Current [A] | 11.6 | 11.6 |
| Total Average Current [A] | 19.6 | 24.6 |
| Fe-Anode Average Current Fraction [%] | 59.2 | 47.2 |
| Material Properties | | |
| Ni Content [%] | 35 | 48 |
| Fe Content [%] | 65 | 52 |
| CTE [$10^{-6}$ C$^{-1}$] | 1.5 | 9.5 |
| Yield Strength [MPa] | 565 | 1050 |
| Grain Size [nm] | 20 | 20 |

Utility for the variable property electrodeposit is to grade the CTE of the deposit by matching the CTE of the initial deposit (1.5 ppm/° C.) closely to that of the substrate (1.0 ppm/° C.) by initially applying the Invar composition followed by a reduction in Fe on the outer layer to reduce the corrosion rate.

WORKING EXAMPLE V

Electrodeposit of Variable Property Nanocrystalline Ni—Fe Layer on Carbon Fiber Epoxy Mold with Modulation of Electrolyte Bath Agitation Rate Another nanocrystalline Ni—Fe layer with a variable property composition was electrodeposited onto another carbon fiber composite (CFC) mold functioning as cathode using the set up described in Example IV. The electroplating conditions and metallic layer properties used are summarized in Table 6 below. The data indicate that adjusting the electrolyte flow conditions can be used to control the chemical composition, the coefficient of thermal expansion and the yield strength of the NiFe-alloy deposit.

TABLE 6

Bath Chemistry and Electrodeposit Conditions for Electrodeposit of Variable property Ni—Fe Electrodeposits with Modulation of Bath Agitation Rate Bath Chemistry

| | |
|---|---|
| 45 g/l | $NiCl_2 \cdot 6H_2O$ |
| 25 g/l | $FeSO_4 \cdot 4H_2O$ |
| 45 g/l | $H_3BO_3$ |
| 4 ml/l | NPA-91 |
| 4 g/l | Sodium Saccharinate chelating agents, stress relievers |

Plating Conditions

| | |
|---|---|
| Temperature: | 60° C. |
| pH: | 2.5 |
| Total Average Cathodic Current Density [mA/cm$^2$]: | 65.8 |
| Multiple Anodes: | yes |
| Total Current Ni-Anode Current [A]: | 11.2 |
| Total Current Fe-Anode Current [A]: | 9.2 |
| Total Average Current [A]: | 20.4 |
| Fe-Anode Average Current Fraction [%]: | 45.1 |
| Anode Shielding: | N/A |
| Forward Pulse On Time [ms]: | N/A |
| Off Time [ms]: | N/A |
| Reverse Pulse On Time [ms]: | N/A |
| Reverse Pulse Peak Current Density [mA/cm$^2$]: | N/A |
| Total Cycle Time: | N/A |
| Frequency [Hz]: | 0 |
| Duty Cycle: | 100% |
| Bath Flow Direction: | tangential |
| Rotation Speed [RPM]: | 0 |
| Particulate Bath Content: | N/A |

| Grading Settings | 1 | 2 |
|---|---|---|
| Electrolyte Agitation Rate (normalized for cathode area) [ml/(min · cm$^2$)] | 70 | 2 |
| Material Properties | | |
| Ni Content [%] | 41 | 60 |
| Fe Content [%] | 59 | 40 |
| CTE [$10^{-6}$ C$^{-1}$] | 3.8 | 11.5 |
| Yield Strength [MPa] | 724 | 1200 |
| Grain Size [nm] | 20 | 20 |

The variable property electrodeposit of the example has the utility to grade the CTE of the deposit by matching the CTE of the deposit to that of the substrate by initially applying a high-Fe composition followed by a reduction in Fe-content towards the outer layer to reduce the corrosion rate.

WORKING EXAMPLE VI

Figure 2:
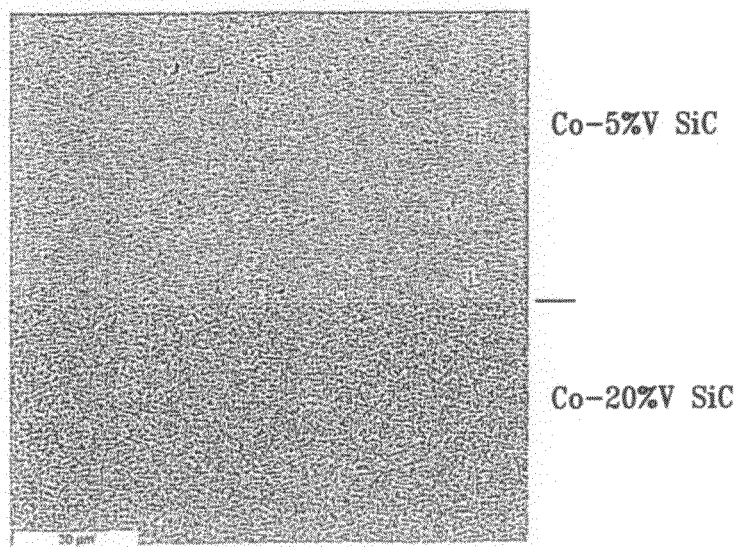
FIG. 2 is an SEM image (backscattered electrons) from an electroformed nanocrystalline Co—SiC material after removal from the substrate variable property stepwise by changing the flow configurations from an incident flow (20 vol % SiC) to a tangential flow (5 vol % SiC) and shows results of Working Example VI.

Electrodeposit of Variable property Nanocrystalline Co—SiC Deposit on Polished Ti Cathode with Modulation of Electrolyte (Bath) Composition by Modulation of Flow Direction Flow A nanocrystalline Co—SiC layer with a variable property composition was electroformed on a 100 cm$^2$ polished Ti cathode in a modified Watts equivalent cobalt bath adopted for Co—SiC composite plating (Integran Technologies Inc., Toronto, Ontario, Canada) using a Dynatronix (Amery, Wis., USA, Dynanet PDPR 40-100-400) pulse power supply. A 15 liter tank was used with a recirculating pump. A flexible LockLine™ was attached to the pump return inside the plating tank, which allowed return flow to be controlled within the tank. The SiC volume fraction was controlled by manipulating the flow at the cathode surface, e.g. by controlling pump flow rate, by use and placement of eductors, by adjusting the relative cathode and/or inlet line positions. The electrolyte composition used is provided as set forth in Table 7 below for two extreme flow configurations, namely "incident" flow characterized by the electrolyte flow directed directly at the cathode (electrolyte flow perpendicular to the cathode surface) and the "tangential" flow characterized the electrolyte flow directed parallel to the cathode surface. A soluble Co anode and standard levelers, brighteners, stress relievers and chelating agents were employed. Conventional Ti-wire mesh anode baskets were employed. Co pieces (Inco Ltd., Sudbury, Ontario, Canada) were used to fill the Co anode basket. The electroplating conditions and metallic layer properties used are summarized in Table 7 below and the deposits are shown in FIG. 2. The data indicate that adjusting the electrolyte flow conditions can be used to control the ceramic volume fraction of the Co—SiC composite deposit.

TABLE 7

Bath Chemistry Electrodeposit Conditions for Variable property Co—SiC Plate with Modulation of SiC Volume Fraction and Cobalt Volume Fraction

| Bath Chemistry | |
|---|---|
| 45 g/l | $CoCl_2 \cdot 6H_2O$ |
| 25 g/l | $CoSO_4 \cdot 4H_2O$ |
| 45 g/l | $H_3BO_3$ |
| 4 ml/l | NPA-91 |
| 4 g/l | Sodium Saccharinate standard levelers, brighteners, stress relievers and chelating agents |
| Particulate Bath Content (SiC) [g/l]: | 10 |
| Particulate Bath volume Fraction [%]: | 0.3 |

| Plating Conditions | |
|---|---|
| Temperature: | 60° C. |
| pH: | 2.5 |
| Average Current Density [$mA/cm^2$]: | 80 |
| Peak Forward Current Density [$mA/cm^2$]: | 320 |
| Forward Pulse On Time [ms]: | $t_{on}$ =2ms |
| Off Time [ms]: | $t_{off}$ =6ms |
| Reverse Pulse On Time [ms]: | N/A |
| Reverse Pulse Peak Current Density [$mA/cm^2$]: | N/A |
| Total Cycle Time [ms]: | 8 |
| Duty cycle: | 25% |
| Frequency [Hz]: | 125 |
| Rotation Speed [RPM]: | 0 |
| Multiple Anodes: | N/A |
| Anode Shielding: | N/A |

| Grading Settings | 1 | 2 |
|---|---|---|
| Electrolyte Flow Rate (normalized for cathode area) [ml/(min · $cm^2$)] | 100 | 100 |
| Flow Configuration | Incident | Tangential |
| Layer thickness [micron] | ~100 | ~100 |
| Material Properties | | |
| SiC Volume fraction [vol %] | 20 | 5 |
| Co Content [vol %] | 80 | 95 |
| Co-Deposit Grain Size [nm] | 15 | 15 |

Modulation of electrodeposit content provides for an increased particulate content in the near surface region providing for enhanced hardness and substantially enhanced wear resistance.

WORKING EXAMPLE VII

Figure 3:
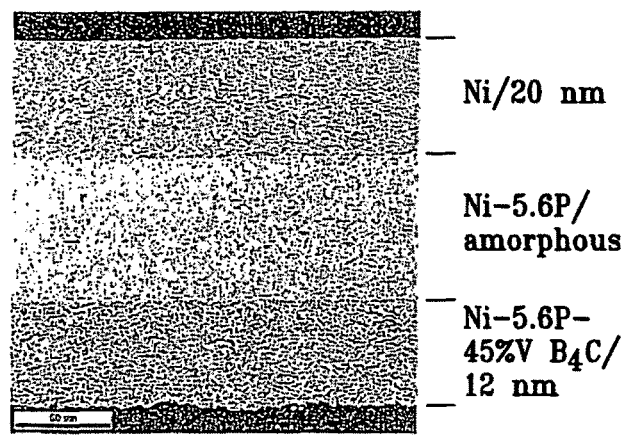
FIG. 3 is a cross-sectional view of the electrodeposited variable property Ni layer consisting of three layers and shows results of Working Example VII. The first layer (thickness: about 60 micron) is composed of pure nanocrystalline Ni with an average grain size of 20 nm, the second layer is comprised of a nanocrystalline-Ni-5.6% P layer having an amorphous microstructure (thickness: about 75 micron) and the third layer is a metal matrix composite comprising a nanocrystalline-Ni-5.6% P layer (average grain size: 12 nm) with $B_4C$ particles (thickness: about 60 micron) therein.

Electrodeposition of Variable Property Nanocrystalline Ni/Amorphous NiP/Nanocrystalline NiP with $BC_4$ Particulate Inclusion with Modulation of Bath Composition This example highlights the use of electrodeposition to form multilayered structures varied in terms of composition and microstructure with an abrupt transition between layers using the same set-up described in Working Example I. FIG. 3 shows a cross-section through electrodeposited Ni having continuous grain size change from 20 nm in the fine-grained Ni, to amorphous Ni—P to a 12 nm fine-grained NiP-$B_4C$ composition. Starting out with a modified Watts bath for depositing fine-grained nickel, property changes were achieved by adding phosphorous acid to the bath resulting in the deposition change to amorphous Ni—P and addition of $B_4C$ particulates to the bath resulting in a fine-grained Ni—P metal matrix composite with 45% by volume $B_4C$. Bath composition and electrodeposition conditions are set forth in Table 8 below.

TABLE 8

Bath Chemistry and Electrodeposit Conditions with Modulation of Bath Composition

| Bath Chemistry | |
|---|---|
| 45 g/l | $NiCl_2 \cdot 6H_2O$ |
| 300 g/l | $NiSO_4 \cdot 6H_2O$ |
| 18 g/l | $H_3BO_3$ |
| 5 ml/l | NPA-91 |
| 2 g/l | Sodium Saccharinate standard levelers, brighteners, stress relievers and chelating agents |

| Plating Conditions | |
|---|---|
| Temperature: | 60° C. |
| pH: | 2.5 |
| Average Current Density ($I_{avg}$) [$mA/cm^2$]: | 80 |
| Peak current density [$mA/cm^2$]: | 320 |
| On Time [ms]: | 2 |
| Off Time [ms]: | 6 |
| Reverse Pulse On Time [ms]: | N/A |
| Reverse Pulse Peak Current Density [$mA/cm^2$]: | N/A |
| Total Cycle Time [ms]: | 8 |
| Frequency [Hz]: | 125 |
| Duty Cycle: | 25% |
| Electrolyte Agitation Rate (normalized for cathode area): | 20 ml/(min · $cm^2$) |
| Bath Flow Direction: | tangential |
| Rotation Speed [RPM]: | 0 |
| Particulate Bath Content (in suspension): | as indicated below |
| Multiple Anodes: | N/A |
| Anode Shielding: | N/A |
| Plating time [min]: | 40 |

| Variable property Settings | 1 | 2 | 3 |
|---|---|---|---|
| Bath Addition | N/A | Addition of Phosphorous Acid ($H_3PO_3$: 45 g/l) | Addition of Boron Carbide, average particle size 5 μm ($B_4C$: 360 g/l) |
| Material Properties | | | |
| Composition | Ni | Ni—5.9P | Ni—5.9P + 45 vol % $B_4C$ |
| Hardness (VHN) | 620 | 611 | 610 |
| Average Grain Size [nm] | 20 | N/A amorphous | 12 |

TABLE 8-continued

Bath Chemistry and Electrodeposit
Conditions with Modulation of Bath Composition

| Layer Thickness [μm] | 60 | 75 | 60 |
|---|---|---|---|
| Taber Wear Index | 21 | 26 | 1.5 |

Grading of deposit composition provides benefits of enhancing the wear rate as indicated by the TWI towards the outer surface and, by inclusion of particulate in inner layer and provides barrier to prevent penetrating corrosion and prevents intergranular corrosion by applying an amorphous intermediate layer.

WORKING EXAMPLE VIII

Figure 4:
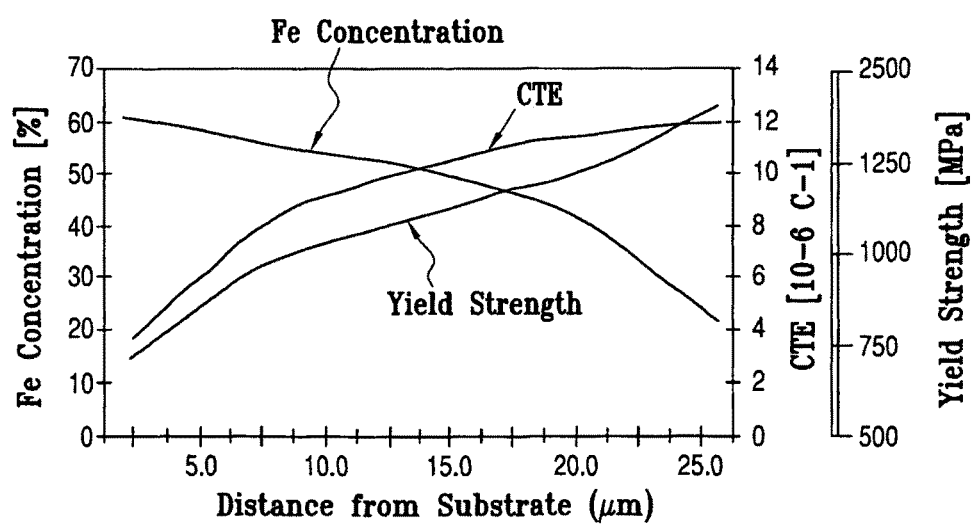
FIG. 4 shows iron concentration, coefficient of thermal expansion and yield strength as a function of distance from substrate surface and shows results of Working Example VIII.

Electrodeposit of Nanocrystalline Ni—Fe Plate with Modulation of Pulse Parameters Fine-grained NiFe-layers with variable property composition were electrodeposited onto a graphite-fiber-epoxy mold cathode from a Nickel Iron plating bath (40 l tank) using grain refiners, levelers, brighteners, stress relievers and chelating agents (Integran Technologies Inc., Toronto, Ontario, Canada). Nickel "R"-rounds (Inco Ltd., Sudbury, Ontario, Canada) and electrolytic iron chips (Allied Metals Corp, Troy, Mich., USA) were used as anode material. The plating current was supplied by a Dynatronix (Amery, Wis., USA, Dynanet PDPR 20-30-100) pulse power supply. The electrolyte and the electroplating conditions used are indicated in Table 9 below. To achieve coefficient of thermal expansion (CTE) matching between a substrate (CTE: ~3.5 ppm/° C.) and the Nanoplate® layer the Fe concentration close to the mold substrate was kept close to that of Invar composition (65% Fe) and the composition was altered to maximize the yield strength near the outer surface. The variation in composition of the metallic layers was achieved by modulating the electroplating conditions by incorporating 1 ms long anodic pulses of increasing height to the 9 ms forward pulse schedule demonstrating the intrinsic flexibility of electrodeposition to alter selected material properties. FIG. 4 shows the variation in yield strength and coefficient of thermal expansion (CTE) values and Fe content across the cross-section of the electrodeposited NiFe foil showing the composition change from 25% Fe to 60% Fe through the deposit thickness. In FIG. 4 reference numeral 1 designates iron concentration; reference numeral 2 designates CTE; and reference numeral 3 desigates yield strength. Using this approach a variety of electrodeposited NiFe coatings on graphite fiber-epoxy mold components as well as freestanding foils were produced with the composition varied continuously, discontinuously, or by combinations thereof. Free standing foils with variable property iron composition in this range are effectively used as thermostastic bi-metals.

TABLE 9

Bath Chemistry and Electrodeposit Condition to
Deposit a Variable property Ni—Fe Plate, with Modulation of Pulse Parameters

| Bath Chemistry | |
|---|---|
| 25 g/l | $FeSO_4 \cdot 6H_2O$ |
| 45 g/l | $NiCl_2 \cdot 6H_2O$ |
| 45 g/l | $H_3BO_3$ |
| 5 ml/l | NPA-91 |
| 2 g/l | Sodium Saccharinate |
| | chelating agents, stress relievers |

| Plating Conditions | |
|---|---|
| Electrolyte Temperature: | 60° C. |
| Peak Forward Current Density: | 50 mA/cm$^2$ |
| On Time: | 9 ms |
| Off time: | N/A |
| Reverse Pulse On Time [ms]: | 1 |
| Total Cycle Time [ms]: | 10 |
| Frequency [Hz]: | 100 |
| Duty Cycle [%]: | 90 |
| pH: | 2.5 |
| Electrolyte Agitation Rate (normalized for cathode area): | 20 ml/(min.cm$^2$) |
| Bath Flow Direction: | tangential |
| Rotation Rate [RPM]: | 0 |
| Particulate Bath Content: | N/A |
| Multiple Anodes: | N/A |
| Anode Shielding: | N/A |

| Variable property Settings | 1 | 2 | 3 | 4 | 5 | 6 | 7 | 8 | 9 | 10 |
|---|---|---|---|---|---|---|---|---|---|---|
| Reverse Pulse Peak Current Density [mA/cm$^2$] | 0 | 4 | 8 | 12.5 | 17 | 21 | 25 | 30 | 33.5 | 37.5 |
| Average Current Density [mA/cm$^2$] | 45.0 | 44.6 | 44.2 | 43.8 | 43.3 | 42.9 | 42.5 | 42.0 | 41.7 | 41.3 |

TABLE 9-continued

Bath Chemistry and Electrodeposit Condition to
Deposit a Variable property Ni—Fe Plate, with Modulation of Pulse Parameters

| Distance from the Substrate [μm] | 2.5 | 5 | 7.5 | 10 | 12.5 | 15 | 17.5 | 20 | 22.5 | 25 |
|---|---|---|---|---|---|---|---|---|---|---|
| Material Properties | | | | | | | | | | |
| Composition [% Fe] | 59.9 | 58.1 | 54.1 | 52.4 | 51.9 | 48.8 | 46.2 | 44.4 | 34.4 | 25.1 |
| CTE [$10^{-6}$ $C^{-1}$] | 3.8 | 5.3 | 8 | 9.5 | 10 | 10.5 | 11 | 11.5 | 11.8 | 12 |
| Yield Strength [MPa] | 724 | 830 | 980 | 1034 | 1050 | 1103 | 1150 | 1181 | 1293 | 1379 |
| Grain Size [nm] | 20 | 20 | 20 | 20 | 20 | 20 | 20 | 20 | 20 | 20 |

The electrodeposit has matching CTE at its interface with mold substrate and provides benefit of preventing delamination while maintaining the physical dimensions to tight tolerances during temperature cycling and also high yield strength on exposed surface providing benefit of being able to provide composite molds at much reduced weights reducing the process cycle times significantly.

WORKING EXAMPLE IX

Variable Property Nanocrystalline Ni—Fe Alloy Electrodeposit into a Foam with Modulation of Deposit Composition The inherent flexibility of the electrosynthesis method provides the opportunity to engineer a high strength transition zone between porous substrate cores and fully dense metallic facing plates. This interface is a critical element in, e.g., sandwich composite designs, which often fail by a delamination mechanism at the core/face plate interface. By controlling the relative deposition rates within, e.g., core foam and at the outer foam surface, a transition zone can be engineered to produce a fully dense surface upon which high strength facing plates can be deposited providing a continuous and high-strength metallurgical bond between the core and facing plates.

An example of such an ultra-light structure of high strength and stiffness synthesized using grading is illustrated in this working example.

A reticulated carbon open-cell foam coupon 2×0.5×1" (20 pores per inch, ERG Materials and Aerospace Corp., Oakland, Calif., USA) was used and placed in a plastic frame closed at the backside to expose the frontal area only to the electrolyte and subjected to the plating conditions set forth in Table 10. The foam served as the cathode. A modified Watts nickel bath adopted for Ni—Fe alloy plating (Integran Technologies Inc., Toronto, Ontario, Canada) was placed in a 40 liter tank and a Dynatronix (Amery, Wis., USA, Dynanet PDPR 40-100-400) pulse power supply was employed. A soluble Ni—Fe anode was employed using Ni rounds (Inco Ltd., Sudbury, Ontario, Canada) and electrolytic Fe rounds (Allied Metals Corp. of Troy, Mich.). Fine-grained Ni-20Fe was deposited part of the way into the open carbon structure and the foam was "increasingly filled" with metallic material towards the surface of foam. Finally a carbon foam free layer was deposited onto the outer surface which was free of any porosity. Table 10 also highlights the volume fraction of the n-Ni-20Fe in three distinct locations.

TABLE 10

Bath Chemistry and Electrodeposit Conditions for
Variable property Nanocrystalline Ni—Fe into a Reticulated
Open Cell Foam

| Bath Chemistry | |
|---|---|
| 260 g/l | $NiSO_4 \cdot 6H_2O$ |
| 45 g/l | $NiCl_2 \cdot 6H_2O$ |
| 8 g/l | $FeCl_2 \cdot 4H_2O$ |
| 45 g/l | $H_3BO_3$ |
| 46 g/l | Sodiumcitrate ($2H_2O$) |
| 2 g/l | Sodium Saccharinate |
| 2.3 ml/l | NPA-91 |
| | chelating agents, stress relievers |

| Plating Conditions | |
|---|---|
| Electrolyte Temperature: | 65° C. |
| pH: | 2.2 |
| Average "Geometric Frontal Area" Current Density: | 100 mA/cm$^2$ |
| Forward Pulse On Time [ms]: | N/A |
| Off Time [ms]: | N/A |
| Reverse Pulse On Time [ms]: | N/A |
| Reverse Pulse Peak Current Density [mA/cm$^2$]: | N/A |
| Total Cycle Time: | N/A |
| Frequency [Hz]: | 0 |
| Duty Cycle: | 100% |
| Rotation Speed [RPM]: | 0 |
| Bath Flow Direction: | tangential |
| Particulate Bath Content: | N/A |
| Multiple Anodes: | N/A |
| Anode Shielding: | N/A |
| Electrolyte Agitation Rate (normalized for cathode frontal area): | 40 ml/(min · cm$^2$) |
| Deposition Rate: | 0.10 mm/hr |

| Grading Settings | 1/substrate | 2/transition layer | 3/outer surface |
|---|---|---|---|
| Material Properties | | | |
| Carbon Content [vol %] | 25 | 25 | 0 |
| Ni—20Fe Content [vol %] | 0 | 50 | 100 |
| Porosity [%] | 75 | 25 | 0 |
| Average Grain Size of Ni—20Fe Deposit [nm] | N/A | 15 | 15 |

Figure 5:
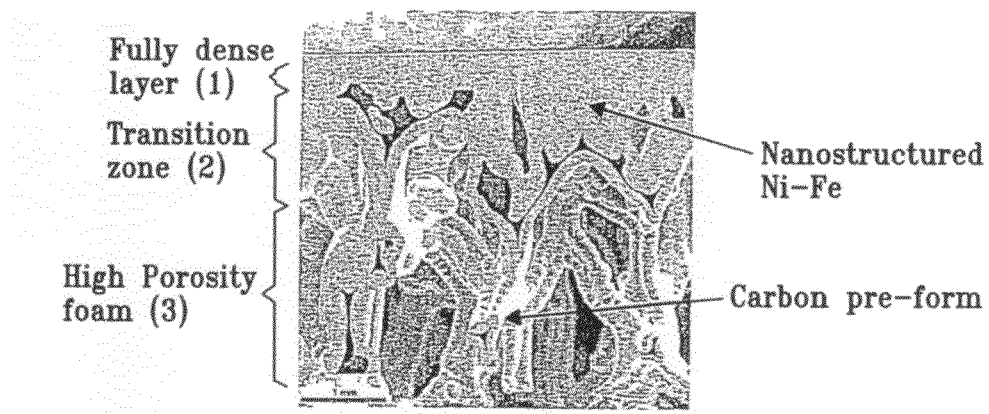
FIG. 5 shows a fine-grained Ni—Fe alloy infiltrated into a porous vitreous carbon substrate to grade the porosity and composition according to a preferred embodiment of the invention and depicts results of Working Example IX.

A cross-section of resulting structure with variable property electrodeposit is shown in FIG. 5.

The utility of the product is to transition a porous structure into a fully dense structure which is intimately fused to provide lightweight solutions for a number of structural applications, i.e., energy absorbing structures for use as crash zones in automobiles or various vehicular and body armor applications. Grading provided fine-grained Ni—Fe and hardness at the surface and porosity at the other end.

WORKING EXAMPLE X

Figure 6:
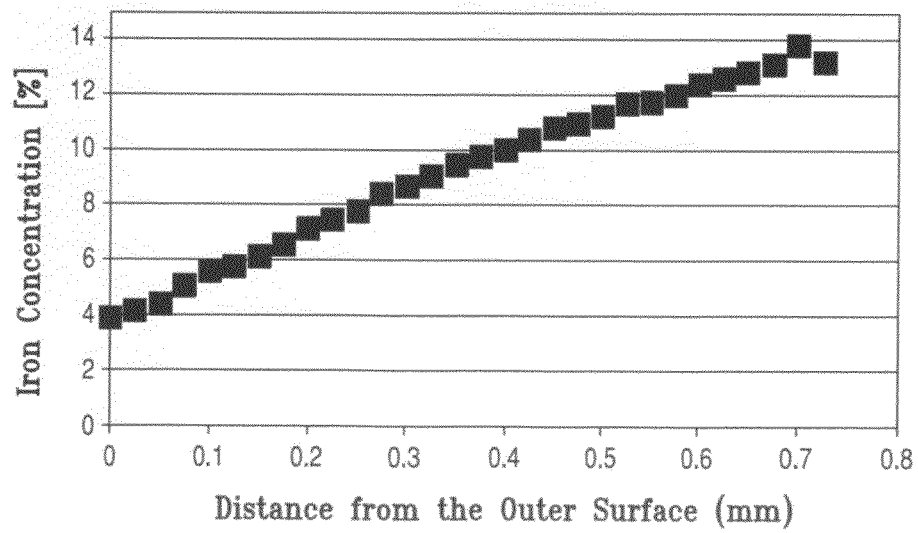
FIG. 6 shows Fe-content across the cross-section of an electrodeposited fine-grained NiFe-alloy foil and depicts results of Working Example X.

Electrodeposit of Nanocrystalline Alloy Deposit Variable Property According to Composition Using Nickel and Iron Anode with Motivation of Current to Iron Anode and Nickel Anode A nanocrystalline Ni—Fe layer with a variable property composition was electrodeposited on a 256 $cm^2$ polished Ti cathode in a modified Watts nickel bath adopted for Ni—Fe alloy plating (Integran Technologies Inc., Toronto, Ontario, Canada) and using a Dynatronix (Amery, Wis., USA, Dynanet PDPR 20-30-100) pulse power supply. A 60 liter tank was used. The electrolyte composition used is provided in Table 11 below. A soluble Ni anode and a soluble Fe anode were employed; the two soluble anodes were connected to separate power supplies to enable the individual control of the anodic currents. The negative leads of both power supplies were connected to the Ti cathode. Current to the iron anode was reduced by approximately 600 mA in a step wise fashion every three hours until the lower limit was attained. Conversely, the current to the nickel anode was increased such that the total cathodic current remained at the specified level. Total deposition time was 14.5 hours. Standard levelers, brighteners, stress relievers and chelating agents were employed. Conventional Ti-wire mesh anode baskets were employed. Ni "R"-rounds (Inco Ltd., Sudbury, Ontario, Canada) were used to fill the Ni anode basket and electrolytic Fe rounds (Allied Metals Corp. of Troy, Mich., USA) were used for the soluble iron electrode. The electroplating conditions used and results are summarized in Table 11 below. Results are indicated in FIG. 6 and indicate that adjusting the relative Ni/Fe anode current densities can be used to control the chemical composition of the NiFe-alloy deposit. Similar results were achieved when metal salt solution additions were used to continuously or abruptly change the bath composition.

TABLE 11

Bath Chemistry and Electrodeposit Conditions for Electrodepositing Ni—Fe Plate Variable property According to Ni and Fe Contents

Bath Chemistry

| | |
|---|---|
| 45 g/l | $NiCl_2 \cdot 6H_2O$ |
| 25 g/l | $FeSO_4 \cdot 4H_2O$ |
| 45 g/l | $H_3BO_3$ |
| 4 ml/l | NPA-91 |
| 4 g/l | Sodium Saccharinate chelating agents, stress relievers |

Plating Conditions

| | |
|---|---|
| Temperature: | 60° C |
| pH: | 2.5 |
| Forward Pulse On Time [ms]: | N/A |
| Off Time [ms]: | N/A |
| Reverse Pulse On Time [ms]: | N/A |
| Reverse Pulse Peak Current Density [$mA/cm^2$]: | N/A |
| Total Cycle Time: | N/A |
| Frequency [Hz]: | 0 |
| Duty Cycle: | 100% |
| Rotation Speed [RPM]: | 0 |
| Bath Flow Direction: | tangential |
| Particulate Bath Content: | N/A |
| Multiple Anodes: | Yes, per settings below |
| Anode Shielding: | N/A |
| Electrolyte Agitation Rate (normalized for cathode area): | 50 ml/(min · $cm^2$) |
| Deposition Rate: | 0.05 mm/hr |

TABLE 11-continued

Bath Chemistry and Electrodeposit Conditions for Electrodepositing Ni—Fe Plate Variable property According to Ni and Fe Contents

| Grading Settings | Initial | Final |
|---|---|---|
| Total Average Cathodic Current Density [$mA/cm^2$] | 65 | 65 |
| Total Current Ni-Anode [A] | 12.8 | 14.65 |
| Total Current Fe-Anode [A] | 2.3 | 0.45 |
| Total Average Current [A] | 15.1 | 15.1 |
| Fe-Anode Average Current Fraction [%] | 15 | 3 |
| Material Properties | | |
| Ni Content [%] | 86.24 | 96.03 |
| Fe Content [%] | 13.76 | 3.97 |
| Grain Size [nm] | 20 | 20 |

The structure with results of Table 11 has utility for, i.e., soft magnetic applications and grading according to increased nickel content towards the outer surface provides the benefit of reduced corrosion rate. The replacement of part of the Ni by Fe also lowers the cost of the coating.

WORKING EXAMPLE XI

Figure 7:
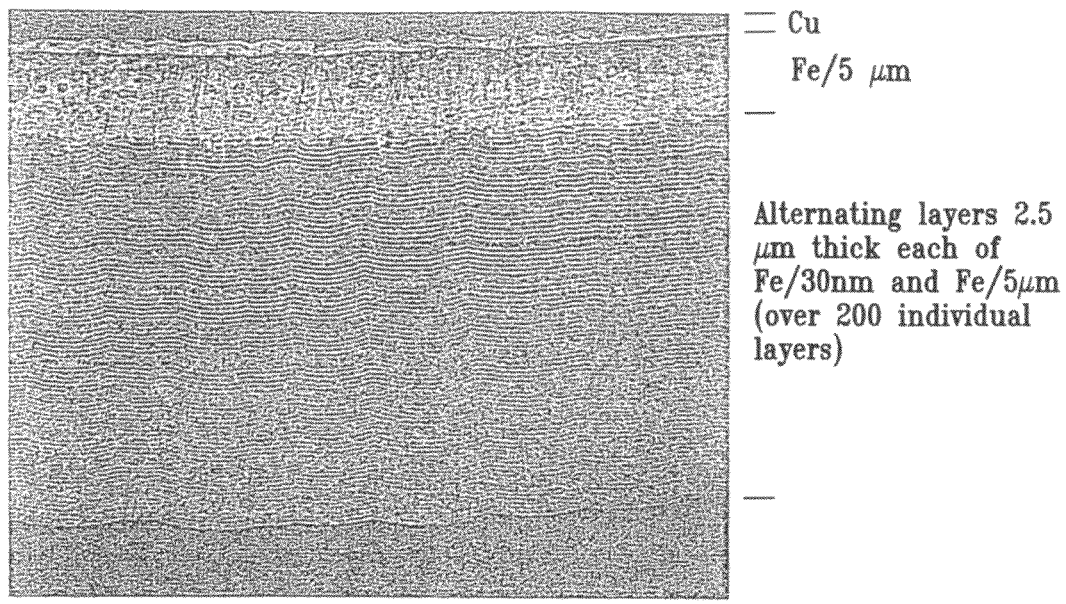
FIG. 7 is a cross-sectional view of the electrodeposited variable property and multilayered Fe structure of Working Example XI consisting of several layers. The first layer (thickness: about 12 micron) near the top of the image is the initial copper layer that was used to render the polymeric substrate (removed subsequent to electrodeposition and not shown in the image) electrically conductive. The second layer (thickness: about 100 micron) is composed of pure ductile coarse-grained Fe with an average grain size of 20 micron; subsequent layers (individual layer thickness: about 2.5 micron) are alternated between fine-grained Fe and coarse-grained Fe. The thickness of the entire structure is approximately 540 micron.

Electrodeposit of Fine-Grained Variable Property Deposit on Copper Metallized Chlorinated Poly(Vinyl Chloride) Substrate by Modulating Plating Parameters A multilayered, grain size variable property Fe-deposit was electroplated on a chlorinated poly(vinyl chloride) (CPVC) cylindrical substrate (50 $cm^2$ surface area) in an iron bath (1.5 l tank) using grain refiners, levelers, brighteners, stress relievers and chelating agents including C77 (Integran Technologies Inc., Toronto, Ontario, Canada). Electrolytic Iron Pieces (Allied Metals Corporation, Troy, Mich.) were used as anode material. The plating current was supplied by a Dynatronix (Amery, Wis., USA, Dynanet PDPR 40-100400) pulse power supply. The electrolyte and the electroplating conditions used are indicated in Table 12 below. Prior to iron plating, the CPVC substrate was copper metallized and this 12 micron-thick conductive layer can be seen near the top of the cross-sectional image that is presented in FIG. 7. Subsequent to metallization, a soft, ductile, coarse-grained (about 5 microns) pure Fe layer (thickness: about 100 microns) was electrodeposited onto the copper. Following this step, alternating variation in grain size hardness and internal stress of the metallic Fe layers was achieved by modulating the electroplating conditions as indicated in Table 12 below. FIG. 7 illustrates the overall structure and individual layer thickness of about 2.5 microns. The hardness of the alternating layers was varied from 160-240VHN (grain size: about 5 micron) to 550-600 VHN (grain size: about 15-40 nm) through the deposit thickness. Using this approach a variety of electrodeposited plates were produced with grain sizes varied continuously, discontinuously, or by combinations thereof.

TABLE 12

Bath Chemistry and Electrodeposit Conditions for Electrodeposit of Variable property Iron Electrodeposit with Modulation of Current Density and Pulse Parameters

Bath Chemistry

| | |
|---|---|
| 110 g/l | $Fe_2SO_4 \cdot 7H_2O$ |
| 100 g/l | $FeCl_2 \cdot 4H_2O$ |
| 45 g/l | $H_3BO_3$ |

TABLE 12-continued

Bath Chemistry and Electrodeposit Conditions for Electrodeposit of Variable property Iron Electrodeposit with Modulation of Current Density and Pulse Parameters

| 30 g/l | C77 chelating agents, stress relievers |
|---|---|

Plating Conditions

| Electrolyte Temperature: | 90° C. |
|---|---|
| pH: | 2 |
| Electrolyte Agitation Rate (normalized for cathode area): | 20 ml/(min · cm$^2$) |
| Rotation Speed [RPM]: | 0 |
| Bath Flow Direction: | tangential |
| Particulate Bath Content: | N/A |
| Multiple Anodes: | N/A |
| Anode Shielding: | N/A |

| Variable property and multilayered Settings | 1 | 2 |
|---|---|---|
| Average Current Density ($I_{avg}$) [mA/cm$^2$] | 82.5 | 200 |
| Peak Forward Current Density [mA/cm$^2$] | 150 | 200 |
| Forward Pulse On Time [ms]: | 7 | N/A |
| Off Time [ms] | 0 | 0 |
| Reverse Pulse On Time [ms] | 3 | 0 |
| Reverse Pulse Peak Current Density [mA/cm$^2$] | 75 | N/A |
| Total Cycle Time [ms] | 10 | N/A |
| Frequency [Hz] | 100 | 0 |
| Duty Cycle [%]: | 70 | 100 |
| Plating Time [min] | 2 | 0.6 |
| Layer Thickness [µm] | 2.5 | 2.5 |
| Material Properties | | |
| Hardness (VHN) | 550 | 160 |
| Average Grain Size [nm] | 30 ± 30% | ~5000 |
| Internal Stress (tensile) [ksi] | 30 | 3 |

The grading provides benefit of being able to build up Fe layers by alternating hard Fe but highly stressed Fe layers with soft layers of low internal stress.

WORKING EXAMPLE XII

Electrodeposit of Variable Property Ni—Fe by Varying Flow Rate

Nanocrystalline Ni—Fe with a variable property composition from the center to the outside of the sample was electrodeposited onto a 100 cm$^2$ section of a carbon fiber epoxy panel cathode using a modified Watts nickel bath adapted for Ni—Fe alloy plating (Integran Technologies Inc., Toronto, Ontario, Canada) in a 40 liter tank using a Dynatronix (Amery, Wis., USA, Dynanet PDPR 20-30-100) pulse power supply. Standard levelers, brighteners, stress relievers and chelating agents were employed. The electrolyte composition and electroplating conditions that were used are summarized in Table 13. A soluble Ni—Fe anode was employed which consisted of a conventional Ti-wire mesh basket filled with Ni "R"-rounds (Inco Ltd., Sudbury, Ontario, Canada) and electrolytic iron chips (Allied Metals Corp, Troy, Mich., USA). A carbon fiber reinforced carbon (CFC) cathode was positioned in the tank such that a flow nozzle, with a 0.5" diameter, was directed at the centre of the sample a distance of 6" away. To grade the deposit in all three dimensions the flow rate was varied between 0 and 6 gallons per minute with flow directed at the center of the samples. Table 14 depicts the compositional data in one grade as a function of the distance from the center for three distinct flow rates. The grain size was determined to be between 20±25% nm.

TABLE 13

Bath Chemistry and Plating Conditions

Bath Chemistry

| 45 g/l | NiCl$_2$•6H$_2$O |
|---|---|
| 25 g/l | FeSO$_4$•4H$_2$O |
| 45 g/l | H$_3$BO$_3$ |
| 4 g/l | Sodium Saccharinate chelating agents, stress relievers |

Plating Conditions

| Average Current Density: | 65 mA/cm$^2$ |
|---|---|
| Temperature: | 60° C. |
| pH: | 2.5 |
| Deposition Rate: | 0.075 mm/hr |
| Forward Pulse On Time [ms]: | N/A |
| Off Time [ms]: | N/A |
| Reverse Pulse On Time [ms]: | N/A |
| Reverse Pulse Peak Current Density [mA/cm$^2$]: | N/A |
| Total Cycle Time: | N/A |
| Frequency [Hz]: | 0 |
| Duty Cycle: | 100% |
| Electrolyte Agitation Rate (normalized for cathode area): | 20 ml/(min · cm$^2$) |
| Rotation Speed [RPM]: | 0 |
| Bath Flow Direction: | tangential |
| Multiple Anodes: | N/A |
| Anode Shielding: | N/A |
| Particulate Bath Content: | N/A |

TABLE 14

Grading as a Function of Distance From Center

| Flow Rate [gpm] | 0 | 2.0 | 3.9 | 5.8 |
|---|---|---|---|---|
| Vertical Distance from Substrate [µm] | 0 | 25 | 50 | 75 |
| Weight % Fe at the Center | 56 | 45 | 43 | 35 |
| Weight % Fe 1 in from the Center | 56 | 47 | 44 | 38 |
| Weight % Fe 2.5 in from the Center | 56 | 48 | 45 | 40 |
| Weight % Fe 4 in from the Center | 56 | 50 | 48 | 46 |
| Weight % Fe 7.5 in from the Center | 56 | 56 | 56 | 56 |
| Variation in Fe Composition in the Layer [%] | 0 | 20 | 23 | 38 |

Figure 8:
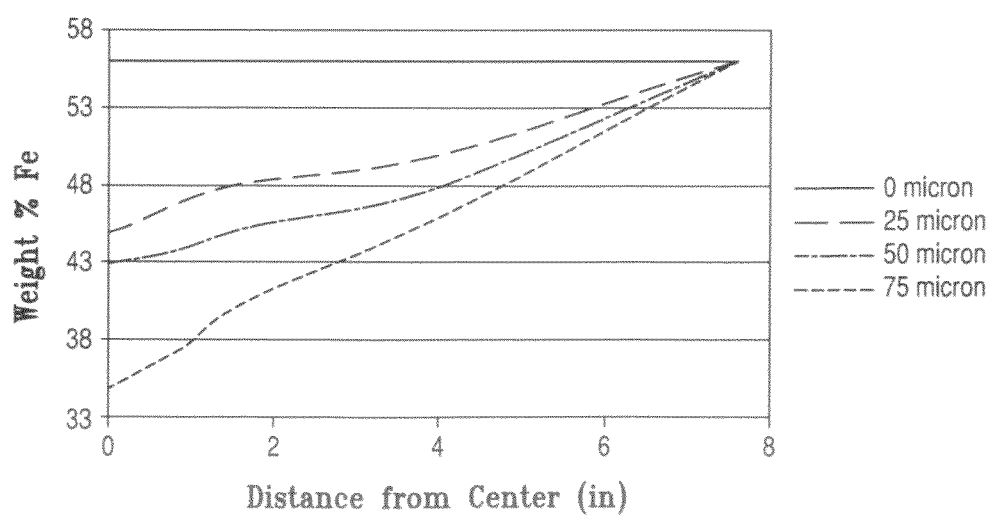
FIG. 8 shows graphs of weight % Fe versus distance from center and shows concurrent grading in the deposit direction for Working Example XII.

Concurrent grading in a deposit direction is shown in FIG. 8.

Similar results are achieved when the flow is directed on the inside or outside of a tube. Using this approach gun barrels can be coated, i.e., with nanocrystalline-NiW or nanocrystalline-CoP based coatings including metal matrix composite coatings including particulates selected from the group of diamond, carbides of B, Si, and W, nitrides of Al, B and Si. Varying of the composition, grain size and/or the particulate content of the electrodeposit along the barrel and throughout the coating thickness can be achieved.

WORKING EXAMPLE XIII

Figure 9:
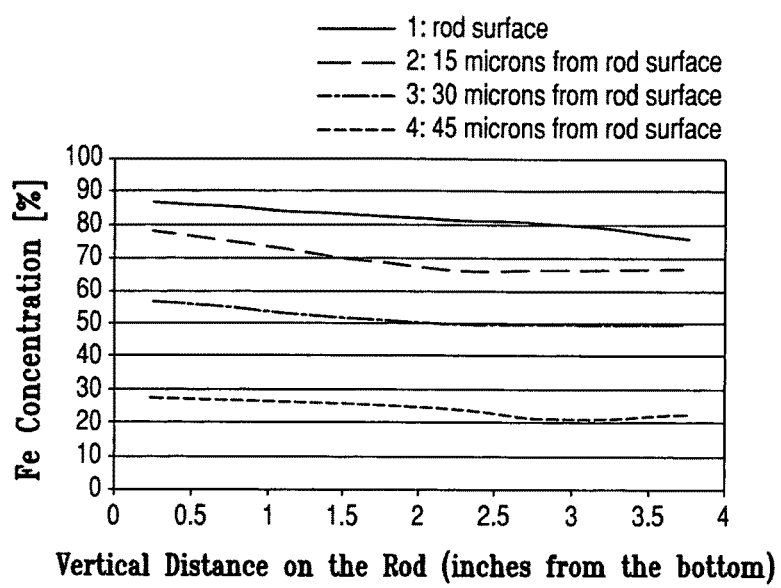
FIG. 9 shows graphs of wt % iron versus distance from bottom and shows results for Working Example XIII.

Graded Ni—Fe Alloy Composition by Varying the Pulse Reverse Conditions and Anode Shielding Nanocrystalline Ni—Fe with a graded composition from the top to the bottom was electrodeposited onto a 60 cm$^2$ section of a cylindrical carbon fiber composite (CFC) rod using a modified Watts nickel bath adopted for Ni—Fe alloy plating (Integran Technologies Inc., Toronto, Ontario, Canada) in a 40 liter tank using a Dynatronix (Amery, Wis., USA, Dynanet PDPR 20-30-100) pulse power supply. Standard levelers, brighteners, stress relievers and chelating agents were employed. The electrolyte composition and electroplating conditions that were used are summarized in Table 15. A soluble Ni—Fe anode was employed which consisted of a conventional Ti-wire mesh basket filled with Ni "R"-rounds (Inco Ltd., Sudbury, Ontario, Canada) and electrolytic iron chips (Allied Metals Corp, Troy, Mich., USA). The soluble Ni—Fe anode was shielded using a polymer sheet such that only the bottom 2" of the anode was exposed and faced the CFC cathode which was positioned in the tank approximately 6" away. To vary the deposit composition in two dimensions reverse current pulses were employed and the average peak pulse reverse current was varied between 68 and 100 mA/cm$^2$. Table 16 below and FIG. 9 show the compositional data as a function of the distance from the bottom of the cylindrical rod for distinct pulse reverse conditions. The data indicates that varying the peak pulse reverse current during plating as well as shielding the anode to create a cathodic current density gradient across the surface of the sample can be used to control the chemical composition of the NiFe-alloy deposit in multiple dimensions. The grain size was determined to be between 20±25% nm.

TABLE 15

Bath chemistry and plating conditions used to electrodeposit a Ni—Fe plate with graded composition Bath Chemistry

| | |
|---|---|
| 45 g/l | NiCl$_2$•6H$_2$O |
| 65 g/l | FeSO$_4$•4H$_2$O |
| 45 g/l | H$_3$BO$_3$ |
| 4 ml/l | NPA-91 |
| 4 g/l | Sodium Saccharinate |
| | standard levelers, brighteners, stress relievers and chelating agents |

Plating Conditions

| | |
|---|---|
| Peak Forward Current Density: | 19.2 mA/cm$^2$ |
| Forward Pulse On Time [ms]: | 21 |
| Off Time [ms]: | N/A |
| Reverse Pulse On Time [ms]: | 9 |
| Total Cycle Time [ms]: | 30 |
| Frequency [Hz]: | 33 |
| Duty Cycle: | 70% |
| Electrolyte Agitation Rate (normalized for cathode area): | 20 ml/(min · cm$^2$) |
| Rotation Rate [RPM]: | 1 |
| Bath Flow Direction: | tangential |
| Multiple Anodes: | N/A |
| Anode Shielding: | yes, 50% of the geometrical anode area is shielded |
| Particulate Bath Content: | N/A |
| Temperature: | 50° C. |
| pH: | 2.0 |

TABLE 16

Variation in iron concentration as a function of the distance from the bottom of the sample for an electrodeposited Nano NiFe deposit produced with a graded current density under different pulse reverse wave conditions

| Variable Property Setting | 1 | 2 | 3 | 4 |
|---|---|---|---|---|
| Reverse Pulse Peak Current Density [mA/cm$^2$] | 8.8 | 9.6 | 11.5 | 12.8 |
| Total Average Current Density [mA/cm$^2$] | 10.8 | 10.6 | 10.0 | 9.6 |
| Distance from the Substrate Surface [µm] | 0 | 15 | 30 | 45 |
| Weight % Fe 0.25 in from Bottom | 86.8 | 78.1 | 56.8 | 27.6 |
| Weight % Fe 2 in from Bottom | 82.3 | 67.2 | 50.5 | 25.0 |
| Weight % Fe 2.9 in from Bottom | 80.9 | 66.5 | 50.4 | 21.3 |
| Weight % Fe 3.75 in from Bottom | 76.4 | 66.9 | 49.5 | 22.9 |
| Variation in Fe Composition Across the Length of the Rod [%] | 12 | 14 | 13 | 16 |

Variations

The foregoing description of the invention has been presented describing certain operable and preferred embodiments. It is not intended that the invention should be so limited since variations and modifications thereof will be obvious to those skilled in the art, all of which are within the spirit and scope of the invention.

What is claimed is:

1. A method of preparing a variable property metallic deposit, comprising the steps:

electrodepositing a metallic material from an aqueous electrolyte in a single electrolytic cell having at least one anode and at least one cathode using DC and/or pulse electrodeposition;

modulating at least one electrodeposition parameter selected from the group consisting of average current density ranging from 5 to 10,000 mA/cm$^2$, forward pulse on time ranging from 0.1 to 500 ms, pulse off time ranging from 0 to 10,000 ms, reverse pulse on time ranging from 0 to 500 ms, peak forward current density ranging from 5 to 10,000 mA/cm$^2$; peak reverse current density ranging from 5 to 20,000 mA/cm$^2$; frequency ranging from 0 to 1,000 Hz; a duty cycle ranging from 5 to 100%;

varying a grain size in a deposit direction by more than 10%;

varying at least one additional deposit property selected from the group consisting of hardness, yield strength, Young's modulus, resilience, elastic limit, ductility, deposit stress, coefficient of thermal expansion, coefficient of friction, electrical conductivity, and magnetic coercive force, and wherein said metallic material deposit has a deposit thickness ranging from 20 microns to 5 cm having a fine-grained microstructure with an average grain size ranging from 2 nm to 5,000 nm throughout 1.5 nm to 5 cm of said thickness and said metallic material deposit has a chemical composition that does not change throughout the thickness of the deposit, and wherein at least two of the electrodeposition parameters are modulated and varying at least two of said properties by more than ten percent.

2. A method of preparing a variable property metallic deposit, comprising the steps:

electrodepositing a metallic material from an aqueous electrolyte in a single electrolytic cell having at least one anode and at least one cathode using DC and/or pulse electrodeposition;

varying at least one deposit property in a deposit direction by more than 10% by modulating at least one electrodeposition parameter selected from the group consisting of average current density ranging from 5 to 10,000 mA/cm$^2$, forward pulse on time ranging from 0.1 to 500 ms, reverse pulse on time ranging from 0 to 500 ms, peak forward current density ranging from 5 to 10,000 mA/cm$^2$, frequency ranging from 0 to 1,000 Hz; a duty cycle ranging from 5 to 100%, bath temperature ranging from 0 to 100° C., working electrode rotation speed ranging from 0 to 1,000 rpm, bath pH ranging from 0 to 12, bath flow direction at cathode ranging from incident (perpendicular) to tangential, shielding anode by covering between 0-95% of the geometrical anode surface area; and varying the at least one deposit property by more than 10% along a length, width, or combinations thereof of the deposit by modulating at least one electrodeposition parameter selected from the group consisting of flow direction at cathode ranging from perpendicular to tangential, shielding anode by covering between 0 and 95% of the geometrical anode surface area, flow rate ranging from 0-10 gpm, reverse pulse peak current density ranging from 5 to 20,000 mA/cm$^2$, and total average current density ranging from 5-20,000 mA/cm$^2$, wherein the at least one deposit property is selected from the group consisting of grain size yield strength, resilience, chemical composition, coefficient of thermal expansion, and magnetic coercive force; and wherein said metallic deposit has a deposit thickness ranging from 20 microns to 5cm having a fine-grained microstructure with an average grain size ranging from 2 nm to 5,000 nm throughout 1.5 nm to 5 cm of said thickness.

3. The method of claim 2, where at least two of the electrodeposition parameters are modulated and varying at least two of said properties by more than ten percent.

4. The method according to claim 2, wherein the metallic material comprises a single chemical element.

5. A method of claim 1 or claim 2, wherein said deposit thickness furthermore contains coarse-grained and/or amorphous sections.

6. The method according to claim 1 or claim 2, wherein the metallic material is a pure metal comprising of a single element selected from the group consisting of Ag, Au, Cu, Co, Cr, Mo, Ni, Sn, Fe, Pd, Pb, Pt, Rh, Ru and Zn.

7. The method according to claim 1 or claim 2, wherein the metallic material is an alloy of one or more elements selected from the group consisting of Ag, Au, Cu, Co, Cr, Mo, Ni, Sn, Fe, Pd, Pb, Pt, Rh, Ru, and Zn.

8. A method according to claim 1 or claim 2, wherein said metallic material contains:
(i) one or more metals selected from the group consisting of Ag, Au, Cu, Co, Cr, Mo, Ni, Sn, Fe, Pd, Pb, Pt, Rh, Ru and Zn;
(ii) at least one element selected from the group consisting of C, O and S; and
(iii) optionally at least one or more elements selected from the group consisting of B, P, Mo, and W.

9. The method of claim 1 or claim 2, carried out to produce a freestanding variable property deposit.

10. The method of claim 1 or claim 2 carried out to produce a freestanding variable property layered deposit.

11. The method of claim 1 or claim 2 where the electrodepositing is onto at least part of a surface of a substrate.

12. The method of claim 1 or claim 2, where the electrodepositing is onto a porous substrate to infiltrate at least part of said porous substrate.

13. The method of claim 1 or claim 2 where electrodepositing is onto a substrate of an orthopedic prosthesis, gun barrel, mold, sporting good, cell phone or automotive component.

14. A method according to claim 1 or claim 2, wherein electrodepositing the metallic material occurs on the inside of a substrate of a gun barrel, and wherein the electrodeposit is a metal matrix composite containing diamond particles.

15. The method of claim 1 or claim 2, wherein the metallic material is a layered deposit and the sublayer thickness is in the range of 1.5 nm to 500 µm.

16. The method of claim 1 or claim 2, wherein the metallic material is a layered deposit and the maximum sublayer thickness is 500 µm.

17. The method of claim 1 or claim 2, wherein said metallic material comprises both layered and graded sections.

18. The method of claim 1 or claim 2, wherein said metallic material comprises both layered and graded sections whereby at least one uniform layer is located between two graded layers.

19. The method of claim 1 or 2, further comprising the step of periodically alternating layers of soft, low internal stress electrodeposited metallic material with harder, higher stressed layers of deposited metallic material with a same metal.

20. The method of claim 1 or 2, wherein said fine grained microstructure exhibits internal stress and/or brittleness without multidimension grading.

21. A method for preparing a pure iron multi-layer deposit having a variable grain size comprising the steps of:
electrodepositing iron from an aqueous electrolyte in a single electrolytic cell;
modulating the average current density from about 80 to about 200 mA/cm$^2$, the frequency ranging from about 0 to about 100 Hz, and the duty cycle ranging from about 70to about 100%;
varying the grain size of directly adjacent layers by more than 10%; and
wherein said pure iron multi-layer deposit has a fine-grained microstructure wherein the individual pure iron layers of the pure iron multi-layer deposit have an average grain size ranging from about 30 to about 5,000 nanometers throughout said deposit thickness, and wherein each individual pure iron layer of the multi-layer pure iron deposit has an internal stress ranging from about 3 to about 30 ksi and said pure multi-layer deposit has a chemical composition that does not change throughout the deposit thickness.

22. A method for preparing a multi-layer nickel deposit having variable grain size comprising the steps:
electrodepositing pure nickel from an aqueous electrolyte in a single electrolytic cell;
modulating the average current density from about 50 to about 80 mA/cm$^2$, the frequency ranging from about 10 to about 125 Hz, the duty cycle ranging from about 25 to about 90%;
varying the grain size of a deposit direction by more than 10%; and
wherein said multi-layer pure nickel deposit has a fine-grained microstructure wherein the individual layers of the multi-layer deposit have an average grain size ranging from about 30 to about 275 nanometers and wherein said multi-layer nickel deposit has a chemical composition that does not change throughout the deposit thickness.

\* \* \* \* \*